United States Patent

Yonemoto

[11] Patent Number: 5,932,902
[45] Date of Patent: Aug. 3, 1999

[54] SOLID-STATE IMAGING DEVICE WITH ELEMENT-SEPARATING ELECTRODES

[75] Inventor: Kazuya Yonemoto, Tokyo, Japan

[73] Assignee: Sony Corporation, Tokyo, Japan

[21] Appl. No.: 08/910,678

[22] Filed: Aug. 13, 1997

[30] Foreign Application Priority Data

Aug. 19, 1996 [JP] Japan .................................. 8-217552
Aug. 19, 1996 [JP] Japan .................................. 8-217558

[51] Int. Cl.$^6$ ...................... H01L 31/062; H01L 31/113
[52] U.S. Cl. ...................... 257/290; 257/291; 257/292; 257/443; 257/448; 257/462
[58] Field of Search .................................. 257/291, 292, 257/290, 448, 443, 462

[56] References Cited

U.S. PATENT DOCUMENTS

| | | | |
|---|---|---|---|
| 4,041,519 | 8/1977 | Melen | 257/292 |
| 4,972,243 | 11/1990 | Sugawa et al. | 257/290 X |
| 5,355,013 | 10/1994 | Parker | 257/292 X |
| 5,726,439 | 3/1998 | Miyawaki et al. | 257/291 X |

FOREIGN PATENT DOCUMENTS

| 0538886 | 4/1993 | European Pat. Off. | 257/292 |
|---|---|---|---|

*Primary Examiner*—William Mintel
*Attorney, Agent, or Firm*—Hill & Simpson

[57] ABSTRACT

A solid-state imaging device has a plurality of photodetector elements arranged on a substrate for photoelectrically converting incident light into signal charges, storing the signal charges, and producing an output signal voltage depending on the amount of the stored signal charges. Element-separating electrodes electrically separate adjacent ones of the photodetector elements from each other. Each of the photodetector elements has a control electrode and a gate insulating film below the control electrode. The gate insulating film has a film thickness varying in the width direction of a channel of the gate insulating film.

10 Claims, 21 Drawing Sheets

SOLID-STATE IMAGING DEVICE WITH ELEMENT-SEPARATING ELECTRODES

BACKGROUND OF THE INVENTION

The present invention relates to a solid-state imaging device, and more particularly to an amplification-type solid-state imaging device which comprises pixels or photodetector elements capable of photoelectrically converting incident light into signal charges, storing the signal charges, and producing an output signal voltage depending on the amount of the stored signal charges.

More particularly, the present invention is concerned with an improvement in the sensitivity linearity of output signals from the pixels when the illuminance of incident line is small, i.e., the signal levels are low, and also in fixed pattern noise due to variations in the sensitivity linearity in the solid-state imaging device.

DESCRIPTION OF THE RELATED ART

There have been known amplification-type solid-state imaging devices having a pixel structure capable of photoelectrically converting incident light into signal charges, storing the signal charges, and producing an output signal voltage depending on the amount of the stored signal charges.

One conventional amplification-type solid-state imaging device has pixels each comprising a MOS transistor which has a ring-shaped gate. If the surface potential of the ring gate is partially or locally varied due to an irregularity of its interfacial level and impurity concentration, then a surface channel through which a source-to-drain current (so-called "channel current") is partially conducted, and signal charges tend to be stored in a portion different from the conducted channel. Therefore, those pixels which suffer irregular interfacial levels and impurity concentrations and those pixels which do not have different sensitivity characteristics when the amount of signal charges is small, i.e., when the illuminance of incident light is low.

For example, the incident light vs. output signal characteristic curve of pixels which have uniform interfacial levels and impurity concentrations has a slope which is as large when signal charges are small as when signal charges are large. However, when signal charges are small, those pixels which suffer irregular interfacial levels and impurity concentrations store the signal charges in a locally concentrated region, resulting in a less tendency to modulate a partially conducted channel portion. Consequently, the incident light vs. output signal characteristic curve of those pixels has a slope that is small when signal charges are small, i.e., the illuminance of incident light is low.

As a result, the linearity of the incident light vs. output signal characteristic curve at the time the illuminance of incident light is low becomes poor, and sensitivity irregularities, i.e., so-called fixed pattern noise, are induced due to linearity irregularities of individual pixels at the of time the illuminance of incident light.

The above problems will be described in detail below with reference to FIGS. 1, 2A, and 2B of the accompanying drawings.

First, basic principles of operation of a pixel for producing an output signal will be described with respect to an amplification-type solid-state imaging device having a pixel structure capable of photoelectrically converting incident light into signal charges, storing the signal charges, and producing an output signal voltage depending on the amount of the stored signal charges. A MOS pixel having a ring-shaped gate of such an amplification-type solid-state imaging device is shown in FIG. 1 of the accompanying drawings. FIG. 1 shows a cross section of the pixel taken along a line at the center of the pixel.

In FIG. 1, the pixel, generally denoted at 1, comprises a MOS transistor having a source region 2 at the center of the pixel, a ring-shaped gate electrode 3 surrounding the source region 2 with a gate insulating film therebetween, and a drain region 4 extending around the ring-shaped gate electrode 3. The drain region 4 serves to separate adjacent pixels from each other.

Basically, the pixel 1 comprises an n-channel MOS transistor, and each of the source region 2 and the drain region 4 comprises an $n^+$ diffused region. A p-type semiconductor region 5 is disposed below the gate electrode 3 for storing signal charges, i.e., holes. The pixel 1 in its entirety is disposed on an n-type semiconductor well region 6 that is positioned as an overflow barrier region on a p-type silicon semiconductor substrate 7, i.e., an overflow barrier region for determining an amount of signal charges and overflowing excessive charges.

The ring-shaped gate electrode 3 is formed of a thin polycrystalline silicon layer, for example, which can pass light therethrough.

When light passes through the ring-shaped gate electrode 3 into the p-type semiconductor region 5 below the gate electrode 3, the p-type semiconductor region 5 photoelectrically converts the light into signal charges (holes), which are stored in the p-type semiconductor region 5.

The signal charges (holes) change the potential of a surface channel 9 of the pixel depending on the amount of the signal charges. Therefore, when the drain region 4 is connected to a power supply and the source region 2 is connected to a constant-voltage power supply, the source-to-drain current varies, and when the drain region 4 is connected to a power supply and the source region 2 is connected to a constant-current power supply, the source voltage varies. At any rate, the source region 2 produces a current or voltage output signal. A signal line 10 is connected to the source region 2. The pixel structure shown in FIG. 1 basically operates in the manner described above.

If the gate electrode for converting incident light into signal charges has a large width in the conventional amplification-type solid-state imaging devices with the pixel structure capable of photoelectrically converting incident light into signal charges, storing the signal charges, and producing an output signal voltage depending on the amount of the stored signal charges, or if the potential below the ring-shaped gate electrode of the MOS pixel structure (FIG. 1) is circumferentially uniform, then, as shown in FIG. 2A of the accompanying drawings, the signal charges 8 produced due to incident light are uniformly distributed (stored) circumferentially below the ring-shaped gate electrode 3, and a channel current 11 as an output signal from the source region 2 is also uniformly distributed circumferentially.

As a result, the signal charges 8 uniformly modulate the surface channel of the pixel, and the output signal is produced depending on the amount of the signal charges 8 stored in the pixel.

When the interfacial level of the channel surface or fixed charges in the gate insulating film (e.g., an oxide film) and the concentration of an impurity in the semiconductor are locally irregular as shown in FIG. 2B of the accompanying drawings, if the potential below the gate electrode 3 is nor uniform circumferentially, e.g., the potential is higher in an area of a point B and lower in another area, e.g., a point A, then as long as signal charges are small, the signal charges (holes) 8 are stored in the other area than the point B, and the channel current 11 flows only through the area of the point B.

Consequently, the signal charges 8 are not effective enough to modulate the channel current that flows only through the area of the point B. When the signal charges are small, therefore, the output signal is small, i.e., the sensitivity is small.

The above phenomenon will be described below with reference to FIG. 3 of the accompanying drawings which shows a vertical one-dimensional potential distribution below the gate electrode 3 at the points A, B.

If, due to the interfacial level between the gate insulating film and the semiconductor and irregularities of fixed charges in the gate insulating film and the concentration of an impurity in the semiconductor, surface potentials $\phi^A_{CH}$, $\phi^B_{CH}$ and potentials $\phi^A_{SH}$, $\phi^B_{SH}$ where signal charges are stored of the points A, B are related to each other as follows:

$\phi^A_{CH} < \phi^B_{CH}$,
$\phi^A_{SH} < \phi^B_{SH}$, then the small signal charges 8 are stored in the other area than the point B, and the channel current 11 flows only through the area of the point B.

Stated otherwise, the area where the small signal charges 8 are stored and the area where the channel current 11 flows are spaced from each other in plane, resulting in a less tendency for the signal charges to modulate the channel current 11.

For the reasons described above, the stored-signal-charge vs. output signal characteristic curve of a pixel in which the potential in the circumferential direction of the ring-shaped gate electrode 3 is uniform as shown in FIG. 2A and the stored-signal-charge vs. output signal characteristic curve of a pixel in which the same potential is irregular as shown in FIG. 2B are plotted as shown in FIG. 4 of the accompanying drawings.

As shown in FIG. 4, the output signal from the pixel in which the potential is uniform as shown in FIG. 2A increases linearly from a small amount of signal charges as the signal charges increase, as indicated by the curve I in FIG. 4. However, the output signal from the pixel in which the potential is irregular as shown in FIG. 2B increases at a lower rate in a region of a small amount of signal charges as the signal charges increase, as indicated by the curve II in FIG. 4. Thus, the curve II has poorer linearity than the curve I.

As a consequence, imaging devices which comprise a one- or two-dimensional array of pixels including randomly positioned pixels as shown in FIGS. 2A and 2B suffer strong fixed pattern noise if the amount of stored charges is small, i.e., if the incident light of low illuminance is applied.

SUMMARY OF THE INVENTION

It is therefore an object of the present invention to provide an improved solid-state imaging device which comprises pixels or photodetector elements capable of photoelectrically converting incident light into signal charges, storing the signal charges, and producing an output signal voltage depending on the amount of the stored signal charges, the solid-state imaging device having improved sensitivity linearity of an output signal at the time the illuminance of incident light is low, i.e., the output signal is small, and also improved fixed pattern noise which would otherwise be large due to sensitivity linearity irregularities.

According to the present invention, there is provided a solid-state imaging device comprising a plurality of photodetector elements arranged on a substrate for photoelectrically converting incident light into signal charges, storing the signal charges, and producing an output signal voltage depending on the amount of the stored signal charges, each of the photodetector elements having a potential distribution for causing a signal charge to tend to be stored and a surface channel current to tend to flow in one position as viewed in plan.

Since each of the photodetector elements, i.e., a pixel, has the above potential distribution, a region where the signal charge is stored and a region where the surface channel current flows are in the same position in the pixel as viewed in plan. Even when the potential distribution in the pixel slightly fluctuates due to the interfacial level, etc. and such fluctuations differ in the pixels, the linearity of incident-light vs. output-signal characteristics is improved and fixed pattern noise due to different linear properties of the pixels is suppressed when the stored signal charge is small, i.e., when the illuminance of incident light is small or the generated signal is small.

According to the present invention, there is also provided a solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of the photodetector elements from each other.

Since the element-separating electrodes electrically separate adjacent ones of the photodetector elements from each other, a region where the signal charge tends to be stored and a region where the surface channel current tends to flow are held in the same position in the pixel as viewed in plan because of a two-dimensional effect of a potential below the each of the element-separating electrodes. Therefore, even when the signal charge is small, the linearity of incident-light vs. output-signal characteristics is improved and fixed pattern noise due to different linear properties of the pixels is suppressed.

According to the present invention, there is also provided a solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of the photodetector elements from each other, each of the photodetector elements having a control electrode and a gate insulating film below the control electrode, the gate insulating film having a film thickness varying in the width direction of a channel of the gate insulating film.

Since adjacent ones of the photodetector elements, i.e., pixels, are electrically separated by the element-separating electrode (i.e., an element-separating region of a MOS structure), a region where the signal charge tends to be stored and a region where the surface channel current tends to flow are held in the same position as viewed in plan because of a constricted channel effect produced by the element-separating electrode. Therefore, the surface channel current and the signal charge storage region are shifted toward a given position (i.e., a central position) in a control electrode of the photodetector element.

Inasmuch as the gate insulating film has its film thickness varying in the width direction of the channel of the gate insulating film, the surface channel current is more likely to concentrate in the given position in the control electrode.

Thus, even when the signal charge is small, the linearity of incident-light vs. output-signal characteristics is improved and fixed pattern noise due to different linear properties of the pixels is suppressed.

According to the present invention, there is further provided a solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of the photodetector elements from each other, each of the photodetector elements having a control electrode and a semiconductor region below the control electrode, the semiconductor region having an impurity concentration varying in the width direction of a channel of the gate insulating film.

With this arrangement, a region where the signal charge tends to be stored and a region where the surface channel current tends to flow are held in the same position as viewed in plan because of a constricted channel effect produced by the element-separating electrode. Therefore, the surface channel current and the signal charge storage region are shifted toward a given position (i.e., a central position) in a control electrode of the photodetector element.

Inasmuch as the semiconductor region has its impurity concentration varying in the width direction of the channel of the gate insulating film, the surface channel current is more likely to concentrate in the given position in the control electrode.

Consequently, even when the signal charge is small, the linearity of incident-light vs. output-signal characteristics is improved and fixed pattern noise due to different linear properties of the pixels is suppressed.

DETAILED DESCRIPTION OF THE PREFERRED EMBODIMENTS

A solid-state imaging device, i.e., an amplification-type solid-state imaging device, according to the present invention has a novel pixel structure which is designed to suppressing linearity degradation and fixed pattern noise by preventing itself from being divided into regions where signal charges are stored and regions where a surface channel current flows due to potential irregularities in pixels. Particularly, the amplification-type solid-state imaging device has MOS gates for separating adjacent pixels from each other.

Figure 1:
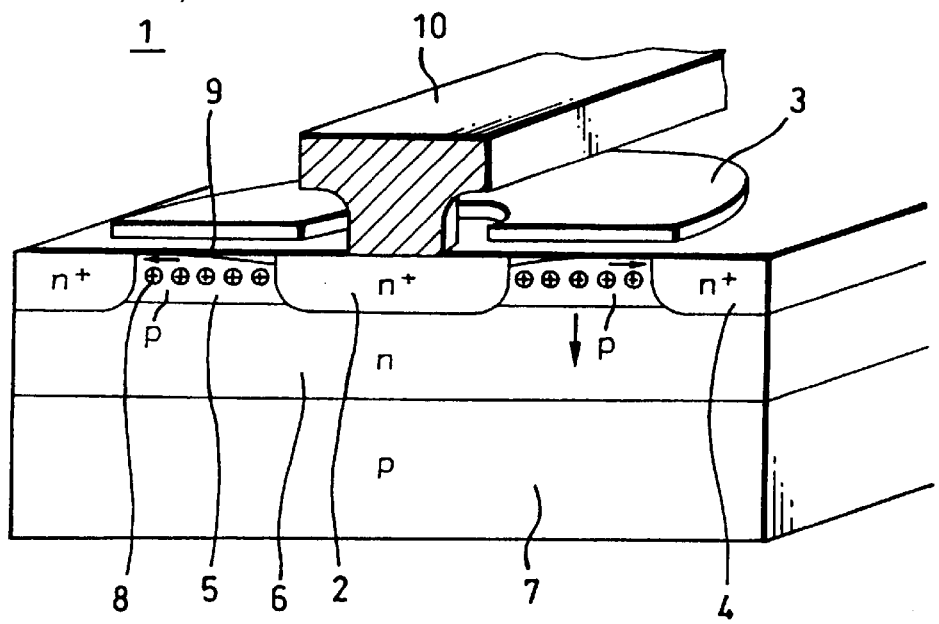
FIG. 1 is a fragmentary perspective view, partly cut away, of a pixel of a conventional amplification-type solid-state imaging device.
Figure 2A:
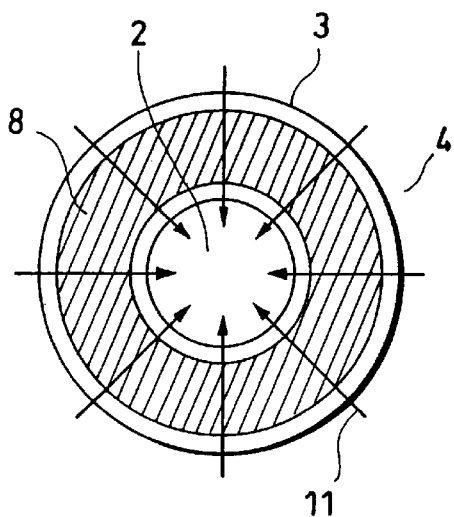
FIG. 2A is a plan view of a conventional pixel in which a potential below a gate is uniform.
Figure 2B:
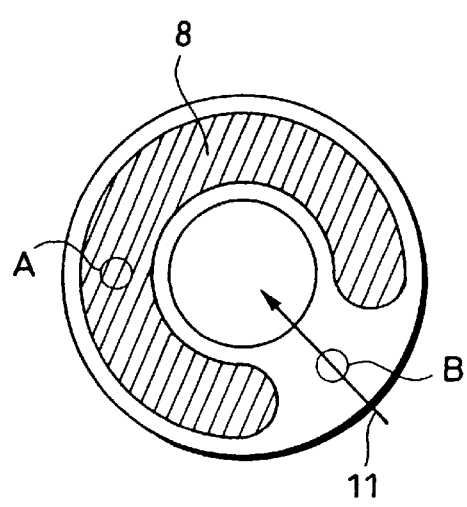
FIG. 2B is a plan view of a conventional pixel in which a potential below a gate is irregular.
Figure 3:
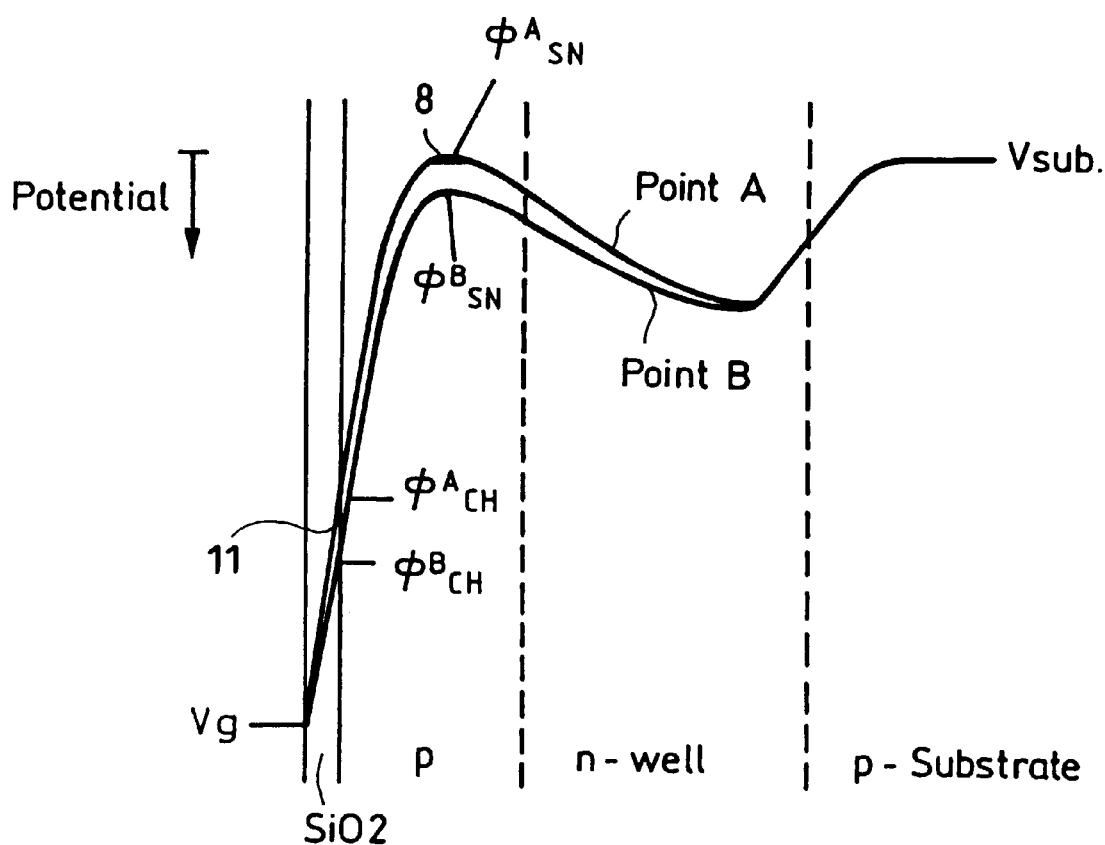
FIG. 3 is a diagram showing a one-dimensional potential distribution below points A, B shown in FIG. 2B.
Figure 4:
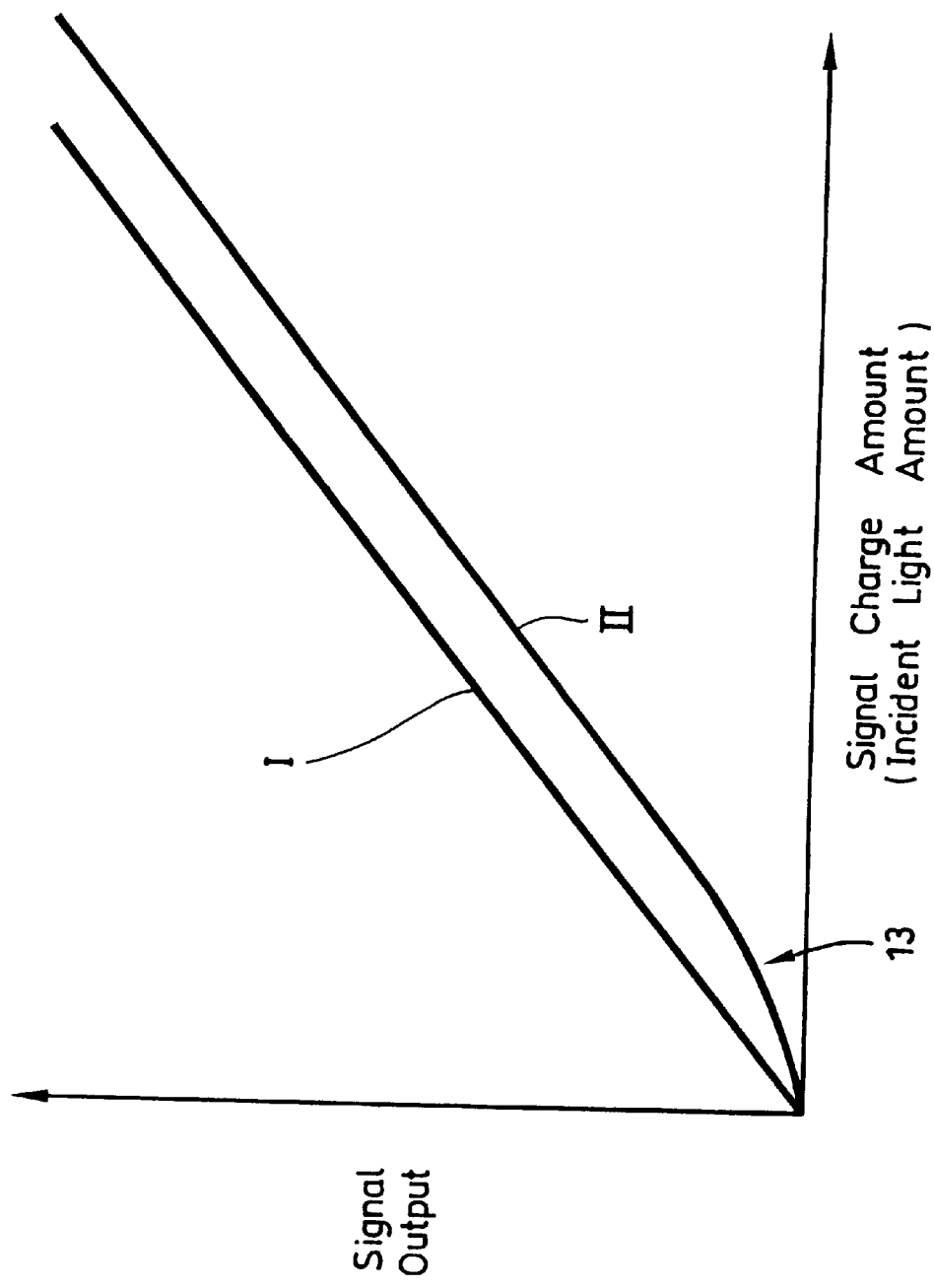
FIG. 4 is a diagram showing stored-signal-charge vs. output signal characteristic curves of the points A, B shown in FIG. 2B.
Figure 5:
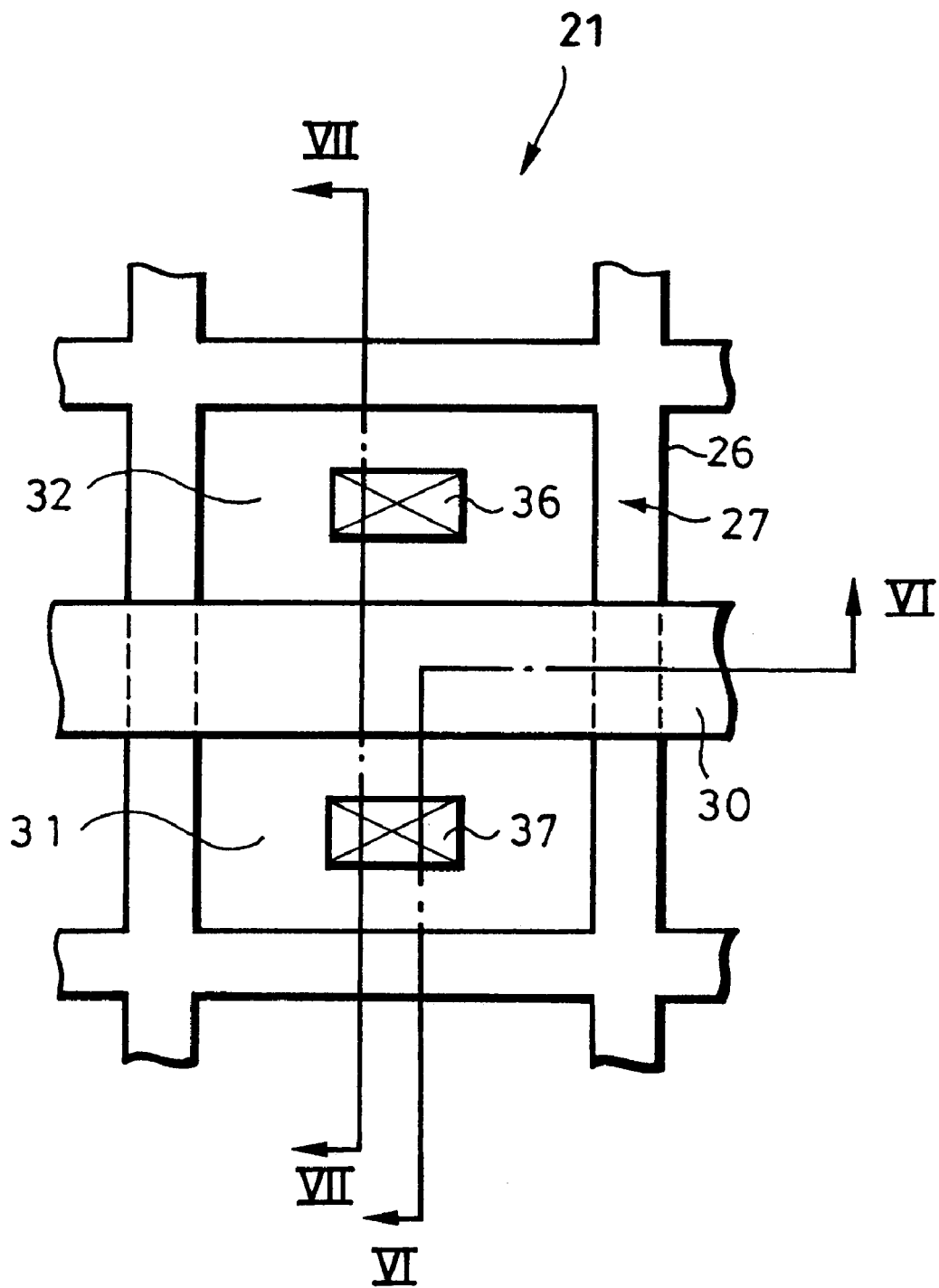
FIG. 5 is a fragmentary plan view of a pixel structure of a solid-state imaging device according to the present invention.
Figure 6:
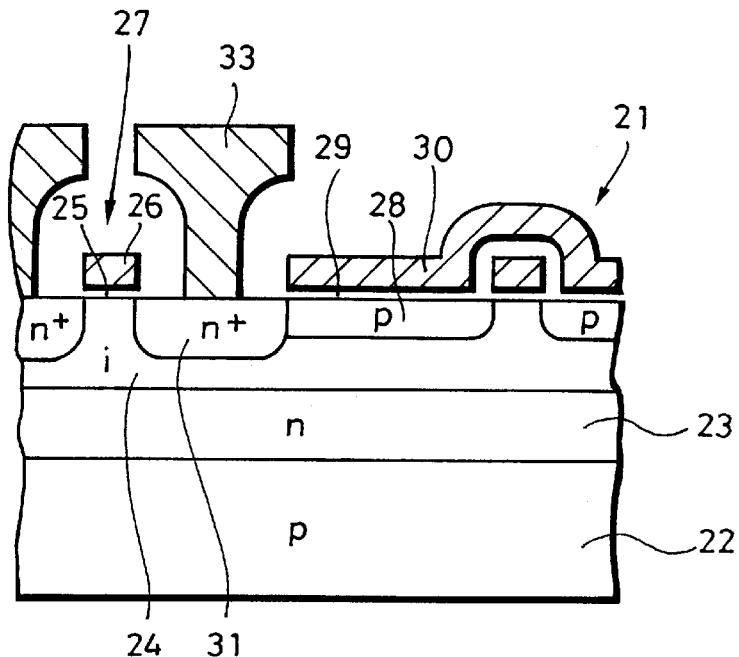
FIG. 6 is a cross-sectional view taken along line VI—VI of FIG. 5.

FIGS. 5 through 6 show an amplification-type solid-state imaging device according to the present invention.

As shown in FIGS. 5 through 6, the amplification-type solid-state imaging device has a silicon semiconductor substrate 22 of a first conductivity type, e.g., p-type, a semiconductor well region 23 of a second conductivity type, e.g., n-type, disposed on the silicon semiconductor substrate 22, a semiconductor well region 24 of an i-type or a similar type (e.g., p⁻⁻-type semiconductor well region) (i-type semiconductor (so-called intrinsic semiconductor) well region in this embodiment) disposed on the n-type semiconductor well region 23, a MOS transistor disposed as a pixel (photodetector element) 21 in the i-type semiconductor well region 24 for photoelectrically converting incident light into signal charges, storing the signal charges, and producing an output signal voltage depending on the amount of the stored signal charges, and a pixel-separating region 27 of a MOS structure comprising a pixel-separating electrode, i.e., a pixel-separating gate electrode 26, disposed on the i-type semiconductor well region 24 through a gate insulating film 25 in surrounding relation to the pixel 21.

The pixel 21 has a straight gate electrode 30 disposed on a p-type semiconductor region 28 in the i-type semiconductor well region 24 through a gate insulating film 29. An n-type source region 31 and an n-type drain region 32 are disposed vertically, for example, one on each side of the gate electrode 30. The pixel 21 is thus constructed as an n-channel MOS transistor.

The pixel-separating gate electrode 26 comprises a first-layer electrode (of first-layer polycrystalline silicon, for example), and the gate electrode 30 of the pixel 21 comprises a second-layer electrode (of second-layer polycrystalline silicon, for example).

The gate electrode 30 is so thin that it can transmit incident light therethrough. When incident light passes through the gate electrode 30 into the p-type semiconductor region 28, the p-type semiconductor region 28 photoelectrically converts the applied light into a signal charge (holes in this embodiment) and stores the signal charge.

To the source region 31, there is connected a vertical signal line 33 in the form of a metal interconnection made of aluminum, for example, through a source contact 37. A power line 34 in the form of a metal interconnection made of aluminum, for example, is connected to the drain region 32 through a drain contact 36.

Figure 8:
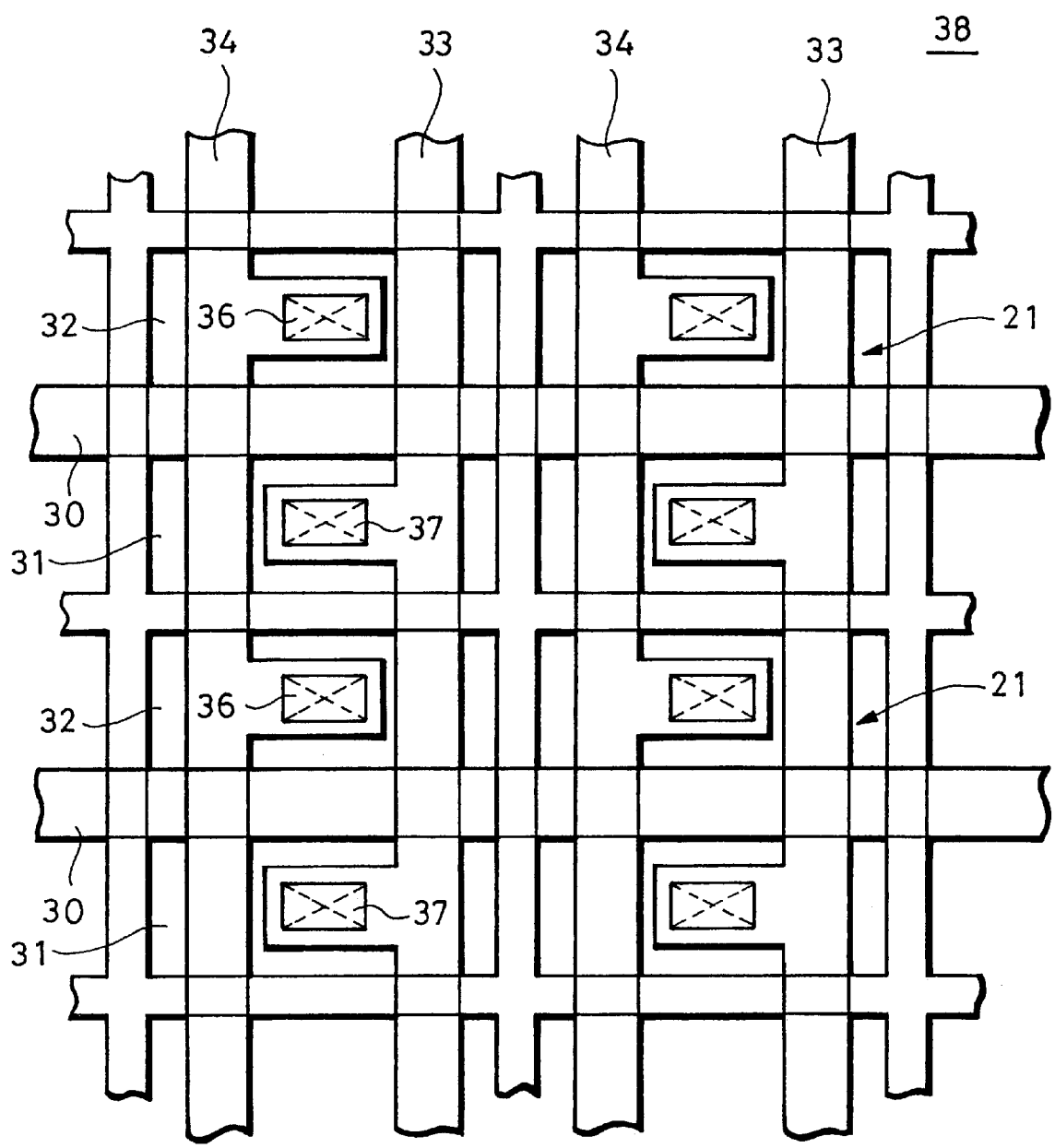
FIG. 8 is a fragmentary plan view of the pixel structure of the solid-state imaging device shown in FIG. 5.

A plurality of such pixels are arranged in a one- or two-dimensional array on a common substrate which comprises the p-type semiconductor substrate 22, the n-type semiconductor well region 23 which serves as an overflow barrier region, and the i-type semiconductor well region 24. As shown in FIG. 8, the pixels are arranged in a matrix, making up an amplification-type solid-state imaging device 38.

The pixels 21 share gate electrodes 30 in respective rows, and have respective source regions 31 connected to common vertical signal lines 33 in respective columns through the source contacts 37 and respective drain regions 32 connected to common power lines 34 in respective columns through the drain contacts 36.

Prior to describing operation of each of the pixels 21 of the amplification-type solid-state imaging device 38, reasons why only the control of an impurity concentration in a semiconductor is unable to separate adjacent pixels from each other will first be described below with respect to a solid-state imaging device according to a comparative example.

Figure 7:
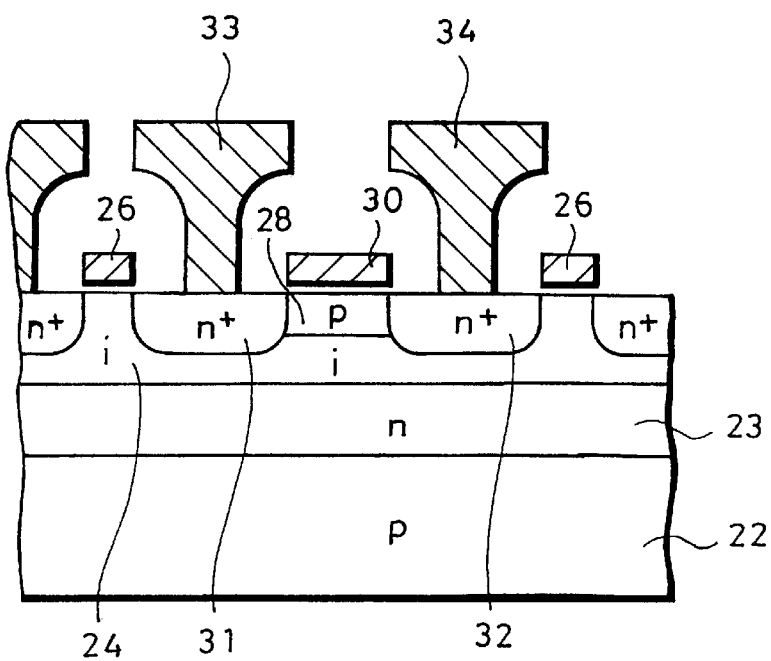
FIG. 7 is a cross-sectional view taken along line VII—VII of FIG. 5.
Figure 9:
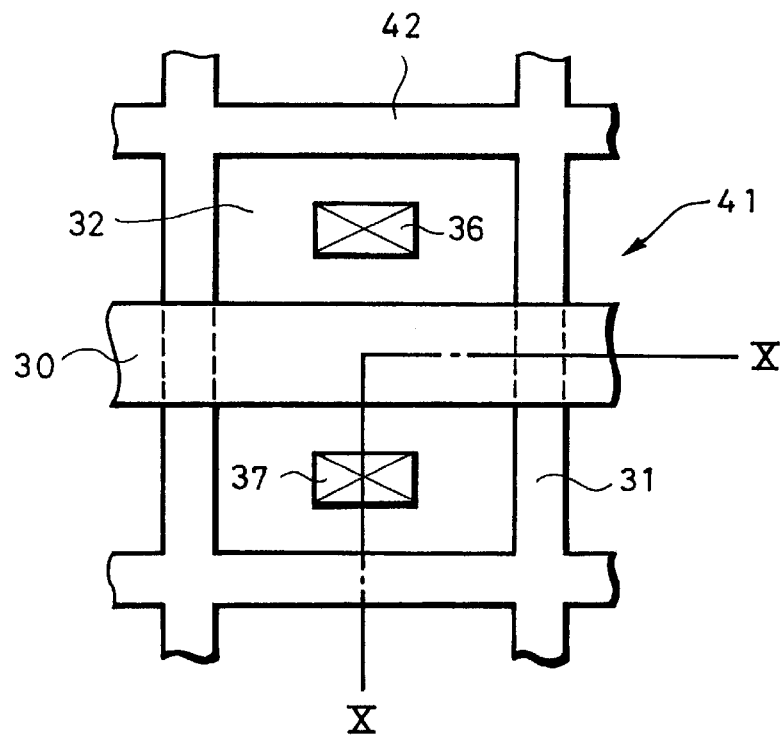
FIG. 9 is a fragmentary plan view of a pixel structure of a solid-state imaging device according to a comparative example.
Figure 10:
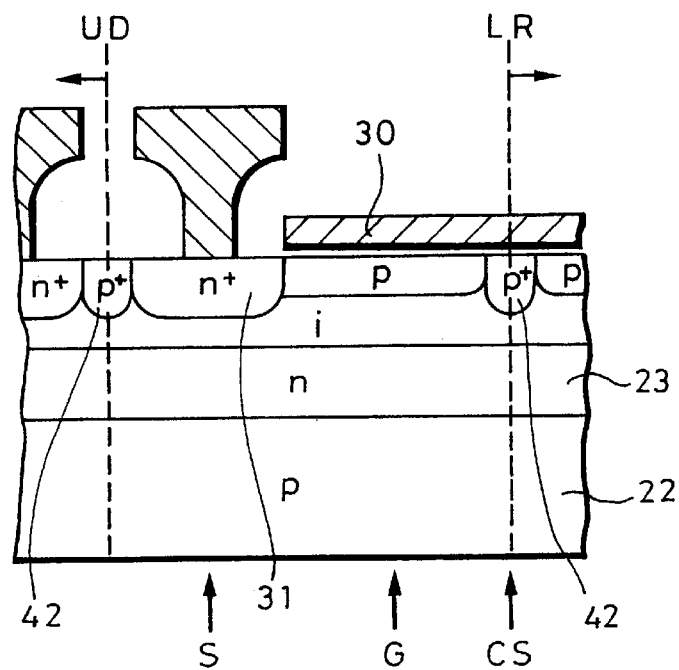
FIG. 10 is a cross-sectional view taken along line X—X of FIG. 9.

It is assumed that as shown in FIGS. 9 and 10, the solid-state imaging device according to the comparative example has a pixel structure comprising a pixel 41 in the form of an n-channel MOS transistor and a pixel-separating region 42 in the form of a p⁺ layer which surrounds the pixel 41. Those parts of the pixel 41 which are identical to those of the pixel 21 shown in FIGS. 7 through 7 are denoted by identical reference numerals, and will not be described in detail below.

As shown in FIG. 10, at a boundary UD between adjacent pixels, the p⁺-layer pixel-separating region 42 is capable of blocking a channel current. However, at a boundary LR between adjacent pixels directly below the gate electrode 30, the p⁺-layer pixel-separating region 42 is incapable of separating a signal charge (holes) stored in the gate from an adjacent pixel.

This phenomenon will be described below with reference to FIG. 11 which shows a potential distribution in a source S, a gate G, and a pixel-separating portion CS in FIG. 10.

Figure 11:
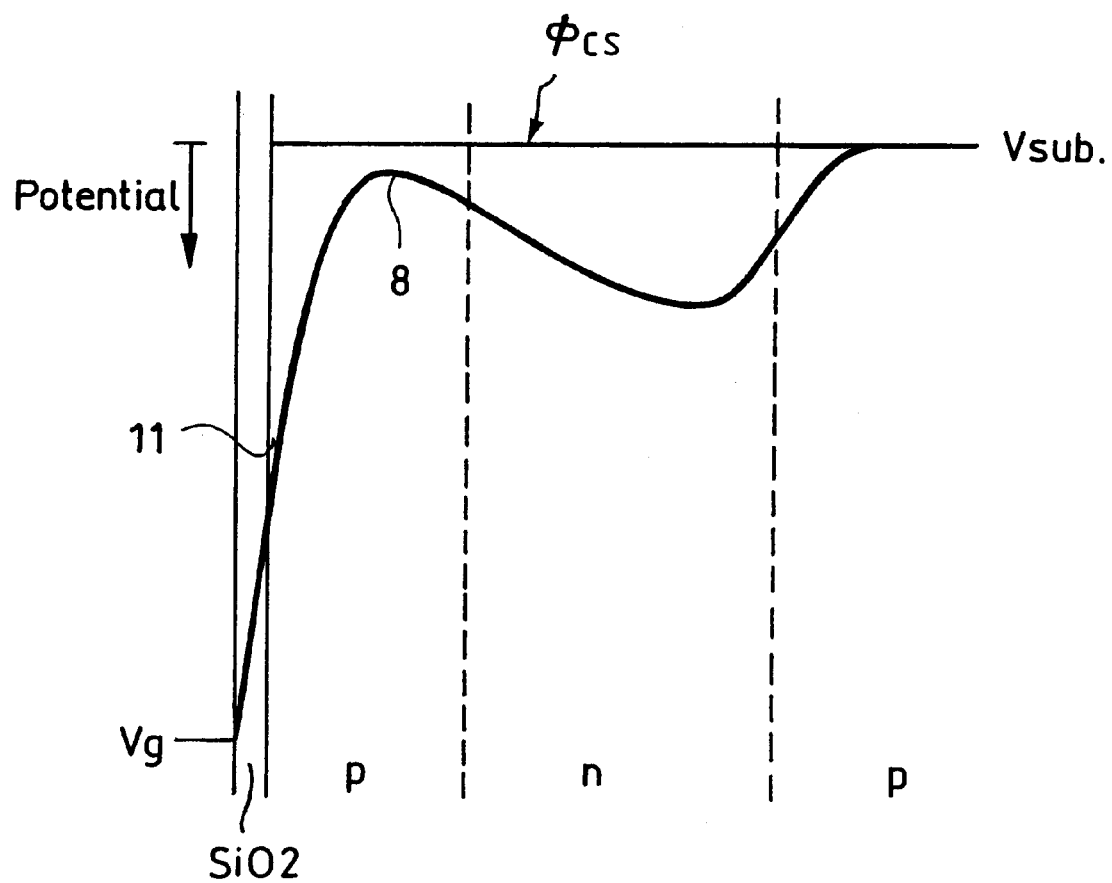
FIG. 11 is a diagram showing a one-dimensional potential distribution of the pixel structure shown in FIG. 9.

As shown in FIG. 11, a comparison between potentials along the depth in the source S and the pixel-separating portion CS indicates that the pixel-separating portion CS is effective to separate the adjacent pixels because the potential $\phi_{CS}$ in the pixel-separating portion CS is low as a whole with respect to a channel current (electrons) 11. However, a comparison between potentials along the depth in the gate G and the pixel-separating portion CS indicates that since the potential in the pixel-separating portion CS is low with respect to a stored charge (holes) 8, the signal charge 8 can freely flow into the p⁺-layer pixel-separating region 42, and the pixel-separating portion CS fails to separate the adjacent pixels.

Stated otherwise, in a device such as an amplification-type pixel which handles two types of carriers (electrons and holes), it is difficult to separate adjacent pixels with diffused regions such as a p⁺ layer and an n⁺ layer.

Heretofore, one of the carriers (the signal charge or holes) is confined circumferentially by a ring-shaped gate electrode to separate adjacent pixels with respect to the two types of carriers.

Operation of each of the pixels of the amplification-type solid-state imaging device 38 will be described below. The principles of separation of adjacent pixels and an ability to suppress characteristics irregularities at the time a signal charge is small will be described below with reference to FIGS. 12, 13A, 13B, 14A, and 14B.

Figure 12:
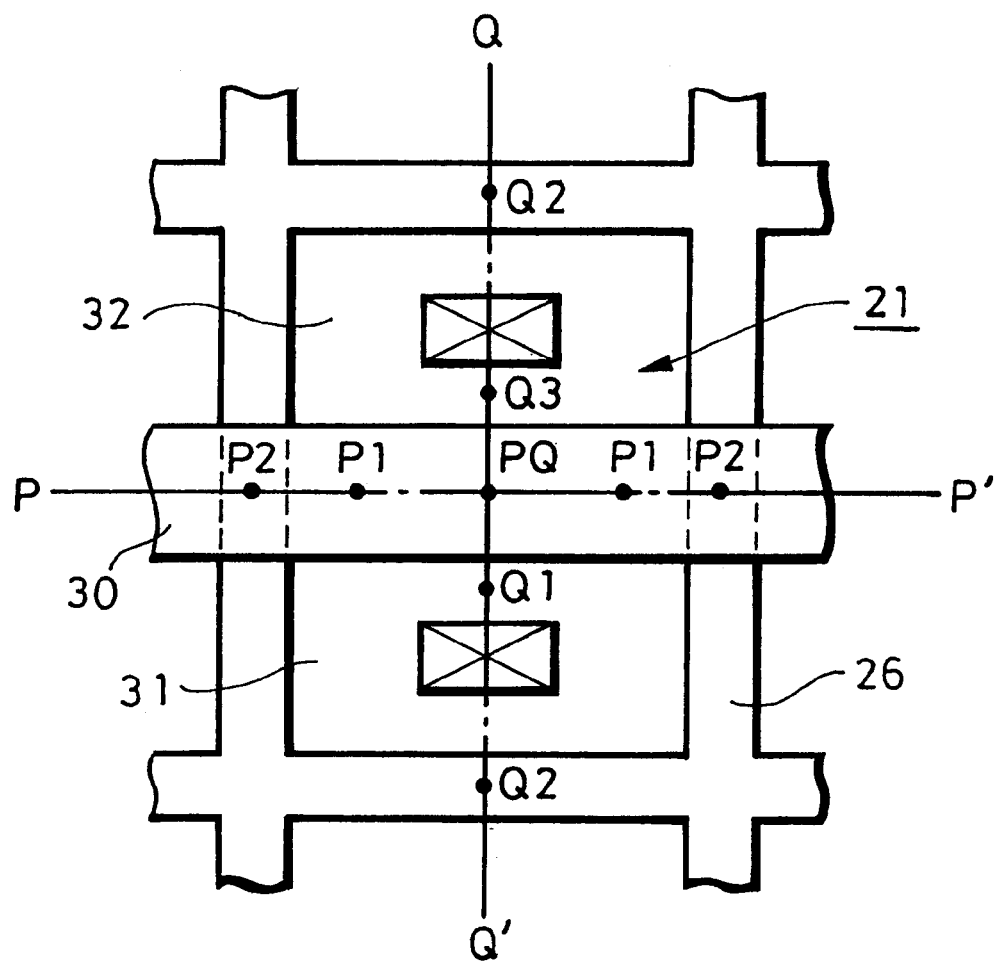
FIG. 12 is a fragmentary plan view of a pixel illustrative of the manner in which the solid-stage imaging device shown in FIG. 5 operates.

FIG. 12, which is similar to FIG. 5, shows in plan an amplification-type pixel 21 in the form of a MOS transistor surrounded by a pixel-separating gate electrode 26 which is formed in a grid-like pattern.

Figure 13A:
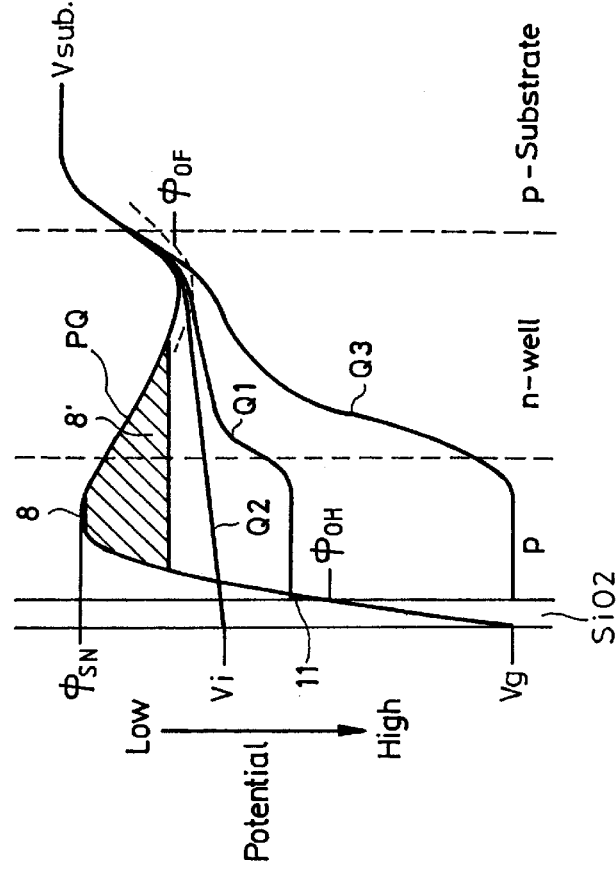
FIG. 13A is a diagram showing a one-dimensional potential distribution on line P–P' of FIG. 12.
Figure 13B:
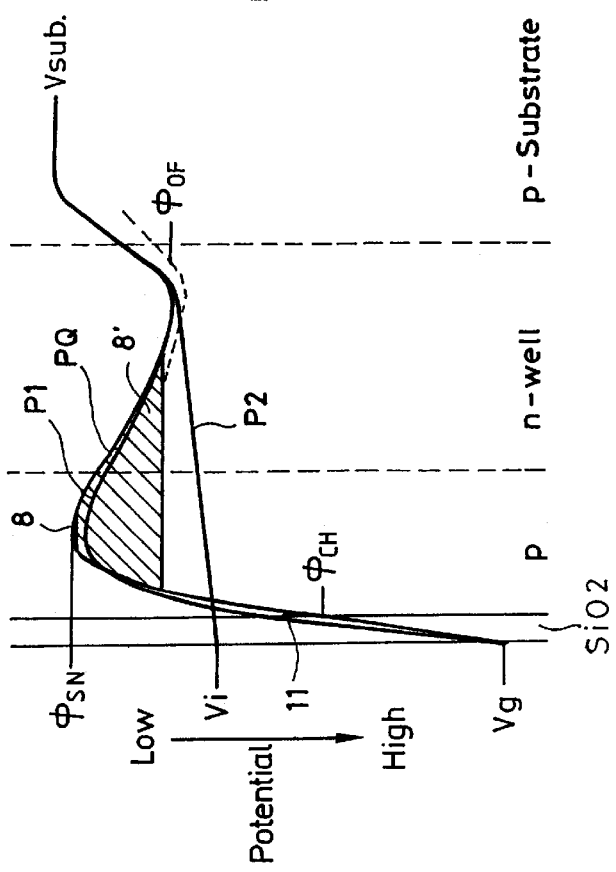
FIG. 13B is a diagram showing a one-dimensional potential distribution on line Q–Q' of FIG. 12.
Figure 14A:
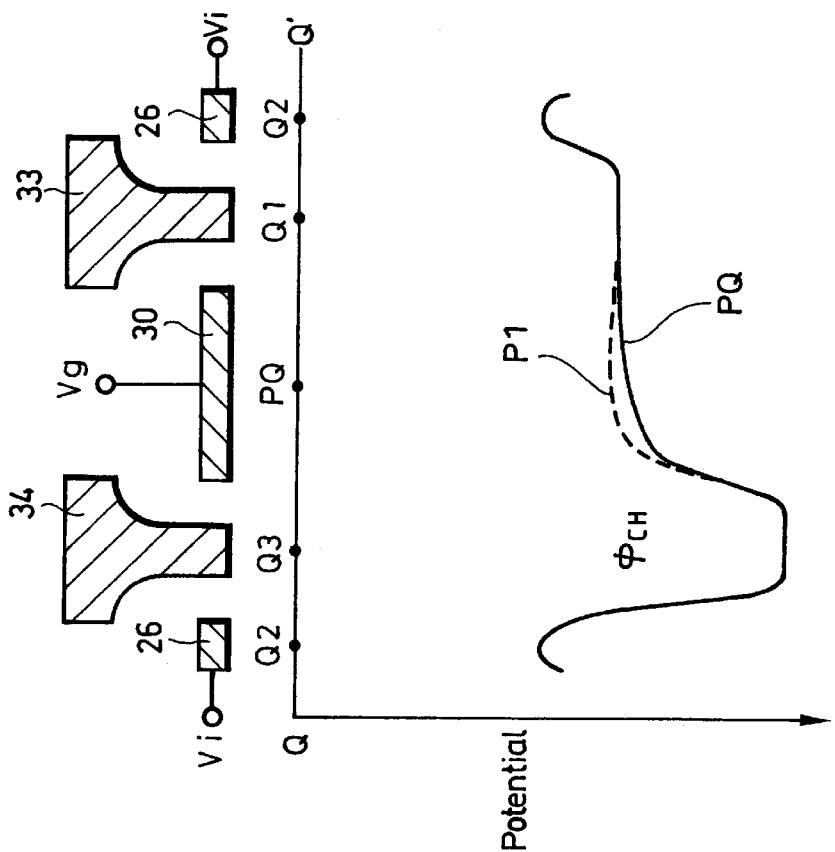
FIG. 14A is a diagram showing a potential distribution on line P–P' of FIG. 12.

FIGS. 13A and 13B show vertical one-dimensional potentials at points PQ, $P_1$, $P_2$, $Q_1$, $Q_2$, $Q_3$ in the pixel 21 shown in FIG. 12, and FIGS. 14A and 13B show a sensor potential $\phi_{SN}$ and a surface channel potential $\phi_{CH}$ respectively along the dot-and-dash lines P–P', Q–Q' in FIG. 12. In FIGS. 13A, 13B, 14A, and 14B, $V_g$ represents a voltage applied to the gate electrode 30 of the pixel 21, $V_i$ a voltage applied to the pixel-separating gate electrode 26, and $V_{sub}$ a substrate voltage applied to the substrate 22.

The pixel-separating region 27 having the pixel-separating gate electrode 26 as shown in FIG. 12 properly functions to separate the pixel 21 from adjacent pixels for the following reasons:

As can be seen from the one-dimensional potentials at the points shown in FIGS. 13A and 13B, since the potential distributions in the vicinity of the surface (from the surface to the overflow barrier) at the points $P_2$, $Q_2$ on the pixel-separating gate electrode 26 are lower than the surface channel potential $\phi_{CH}$ at the point PQ, for example, and the potentials in the vicinity of the surface at the points $Q_1$, $Q_3$ in a region shallower than the overflow barrier, no channel current will leak.

Furthermore, since the potential distributions in the vicinity of the surface (from the surface to the overflow barrier) at the points $P_2$, $Q_2$ on the pixel-separating gate electrode 26 are higher than the sensor potential $\phi_{SN}$ where the signal charge is stored at the points PQ, $Q_1$, and since the potential at the point $P_2$ is higher than a potential $\phi_{OF}$ of the overflow barrier in the vicinity of a depth where the signal charge is stored even if the excessive signal charge 8 is stored, the signal charge 8 will not leak into the adjacent pixels.

Stated with respect to separation of the signal charge between the adjacent pixels, since the potentials at the points $P_2$, $Q_2$ are linearly higher from the potential $\phi_{OF}$ of the overflow barrier toward the surface, the excessive signal charge 8 necessarily flows deeply into the substrate, i.e., overflows into the substrate 22, and do not leak into the adjacent pixels.

Below the pixel-separating gate electrode 26, the potential distribution along the depth of the substrate is established such that it is higher than the potential $\phi_{OF}$ of the overflow barrier, lower than the surface channel potential $\phi_{CH}$, and linearly higher from the potential $\phi_{OF}$ of the overflow barrier toward the surface.

The above potential distribution can be achieved by forming the semiconductor region 24 below the pixel-separating gate electrode 30 as a semiconductor region of an i-type or a similar type.

The ability to suppress characteristics irregularities at the time the signal charge 8 is small will be described below.

A comparison between the points PQ, $P_1$ as can be seen from the potential distributions shown in FIG. 13A, shows that the surface channel potential $\phi_{CH}$ at the point PQ is higher than the surface channel potential at the point $P_1$ and the sensor potential $\phi_{SN}$ at the point PQ is lower than the sensor potential at the point $P_1$ due to a two-dimensional effect, i.e., a proximity effect (constricted channel effect), which the potential of the pixel-separating gate (the point $P_2$) has on the potential at the point $P_1$. Therefore, the channel current 11 tends to flow toward the point PQ and the signal charge 8 tends to stay at the point PQ, so that when the amount of the signal charge is small, the signal charge is collected at the point PQ, causing the channel current to tend to flow to the point PQ. Consequently, even when the potential varies owing to the interfacial level and the fixed charge in the gate insulating film, the amplification-type solid-state imaging device 38 is less subject to the phenomenon that is liable to occur with the conventional ring-shaped gate electrode, i.e., a region where the signal charge is stored and a region where the channel current flows are separate from each other. Specifically, even when the surface channel potential $\phi_{CH}$ and the sensor potential $\phi_{SN}$ suffer irregularities due to the interfacial level and irregularities in the fixed charge in the gate insulating film and the impurity concentration in the semiconductor, the two-dimensional effect of the pixel-separating gate is effective to displace the channel current and the position of the region where the signal charge is stored toward the center of the gate electrode of the pixel at all times, for thereby suppressing irregularities of the input/output characteristics at the time the signal charge is small.

The potential at the point PQ is distributed to allow channel current to flow and the signal charge to be collected more easily than at the point $P_1$ because the surface potential $\phi_{CH}$ at the point $P_1$ is lower and the sensor potential $\phi_{SN}$ at the point $P_1$ is higher under the influence of a substantially constant potential distribution (the two-dimensional effect, i.e., the so-called constricted channel effect) along the depth at the point $P_2$ (i.e., below the pixel-separating gate electrode 30).

FIG. 14A shows how the sensor potential $\phi_{SN}$ is distributed along the line P–P' in FIG. 12 by the pixel-separating gate electrode 26 (the points $P_1$, $P_2$).

As illustrated by the one-dimensional potentials at the points PQ, $P_1$, $P_2$ in FIG. 13A, the sensor potential $\phi_{SN}$ is such a distribution that the sensor potential $\phi_{SN}$ below the gate electrode 30 of the pixel 21 is low at its center (i.e., in the vicinity of the point PQ) for storing the signal charge, due to the two-dimensional effect from the potential below the pixel-separating gate electrode 26.

Figure 14B:
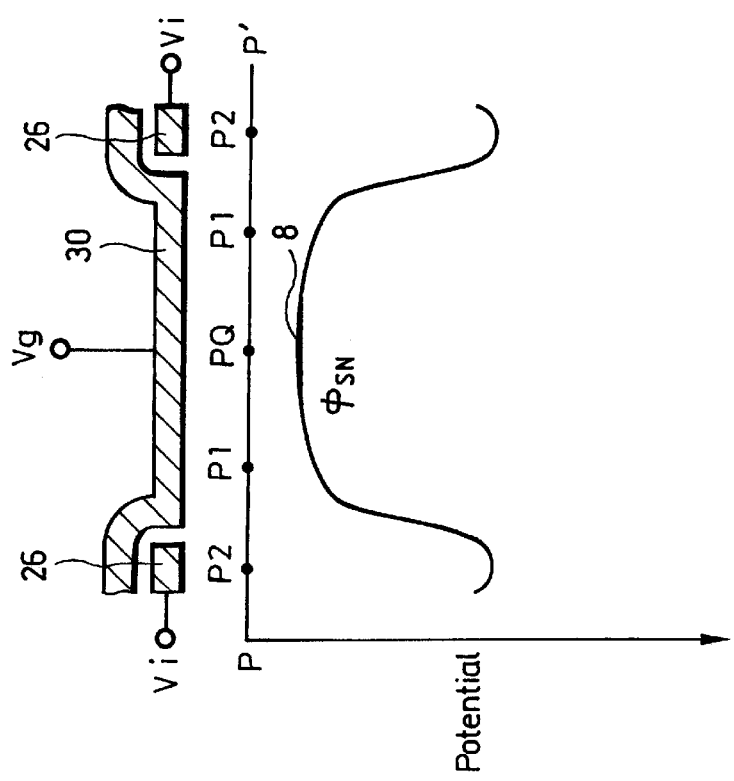
FIG. 14B is a diagram showing a potential distribution on line Q–Q' of FIG. 12.

FIG. 14B shows the surface channel potential $\phi_{CH}$ along a line passing through the point PQ and the point $P_1$ parallel to the line Q–Q' in FIG. 12. Inasmuch as the surface channel potential $\phi_{CH}$ passing through the point PQ is higher than the potential at the point $P_1$, it permits a surface channel current to flow easily.

As described above, according to this embodiment, the pixel 21 is surrounded by the pixel-separating gate electrode 26 in a structure such that the potential below the pixel-separating gate electrode 26 is established so as to be gradually lower from the surface to the depth of the overflow barrier for preventing the signal charge 8 from leaking into the adjacent pixels, the surface potential of the pixel-separating gate electrode 26 is lower than the channel potential in pixel operation to prevent the channel current 11 from flowing into the adjacent pixels, and the two-dimensional effect of the potential of the pixel-separating gate region causes the signal charge to be easily stored in the gate center of the pixel 21 and also causes the channel current to flow easily. Even when the potential distribution in the pixel slightly fluctuates due to the interfacial level, etc. and such fluctuations differ in the pixels, the sensitivity linearity is not degraded and fixed pattern noise due to different properties of the pixels is suppressed when the signal charge is small, i.e., when the illuminance of incident line is small.

Figure 15:
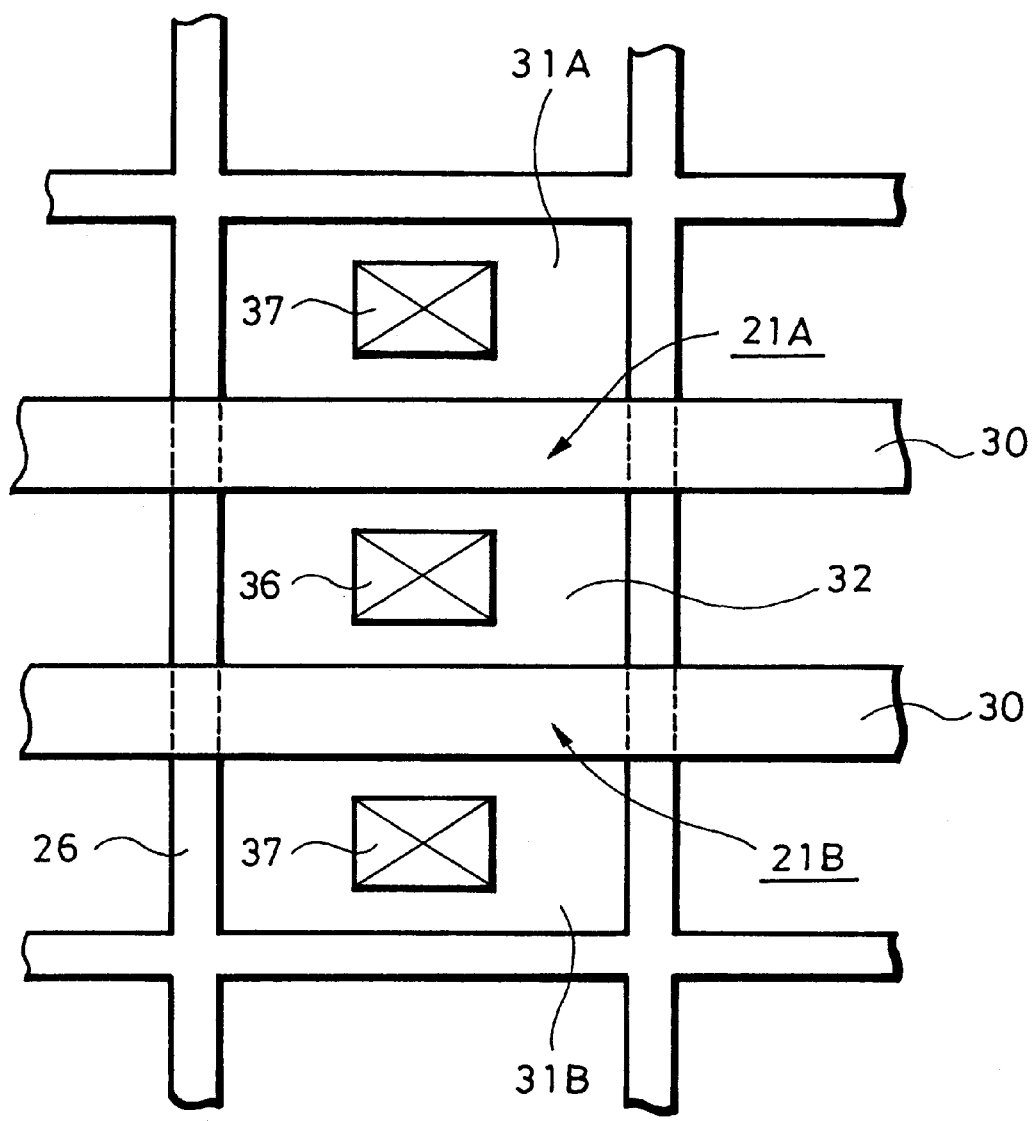
FIG. 15 is a fragmentary plan view of a pixel structure of a solid-state imaging device according to another embodiment of the present invention.
Figure 16:
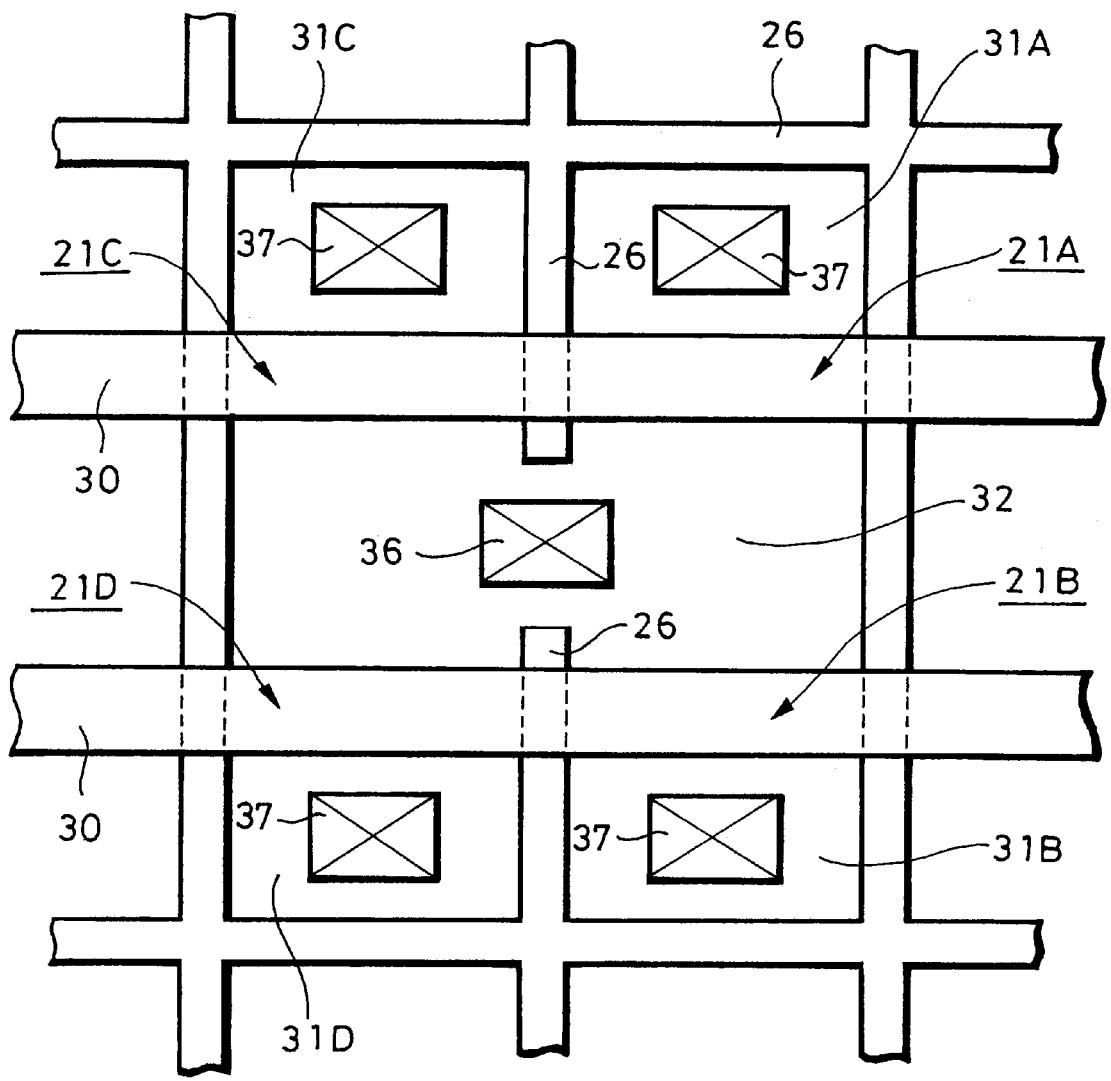
FIG. 16 is a fragmentary plan view of a pixel structure of a solid-state imaging device according to still another embodiment of the present invention.

FIGS. 15 and 16 show amplification-type solid-state imaging devices according to other embodiments of the present invention.

In the foregoing embodiment, a pixel-separating gate electrode surrounds each single pixel. According to the embodiments shown in FIGS. 15 and 16, a pixel-separating gate electrode surrounds a plurality of pixels and surrounded pixels have a common principal electrode, i.e., a drain electrode.

In the embodiment shown in FIG. 15, a pixel-separating gate electrode 26 is disposed in surrounding relation to two pixels 21A, 21B that are vertically adjacent to each other.

The two pixels 21A, 21B have a common drain region 32 and respective source regions 31A, 31B disposed vertically one on each side of the drain region 32. A gate electrode 30 is disposed between the drain region 32 and the source region 31A and another gate electrode 30 is disposed between the drain region 32 and the source region 31B. The drain region 32 is connected to a power line (corresponding to a drain electrode), and the upper and lower source regions 31A, 31B are connected to a common vertical signal line (corresponding to a source electrode).

In the embodiment shown in FIG. 15, a pixel-separating gate electrode 26 is disposed in surrounding relation to four pixels 21A, 21B, 21C, 21D that are vertically and horizontally adjacent to each other.

The four pixels 21A, 21B, 21C, 21D have a central common drain region 32 and respective source regions 31A, 31B, 31C, 31D disposed vertically two on each side of the drain region 32. Gate electrodes 30 are disposed between the drain region 32 and the four source regions 31A, 31B, 31C, 31D. The pixel-separating gate electrode 26 has a portion extending between the source regions 31C, 31A that are horizontally adjacent to each other toward the central drain region 32 and another portion extending between the source regions 31D, 31B that are horizontally adjacent to each other toward the central drain region 32.

A power line is connected to the common drain region 32, and vertical signal lines are connected respectively to the source regions 31A, 31B in a column and the source regions 31C, 31D in another column.

With the embodiment shown in FIG. 15, since the drain region is shared by the two pixels, it is possible to reduce the size of the pixels. With the embodiment shown in FIG. 16, since the drain region is shared and only one drain contact is needed for the four pixels, it is possible to reduce the size of the pixels and the freedom of the layout of drain and source interconnections is high.

Figure 17:
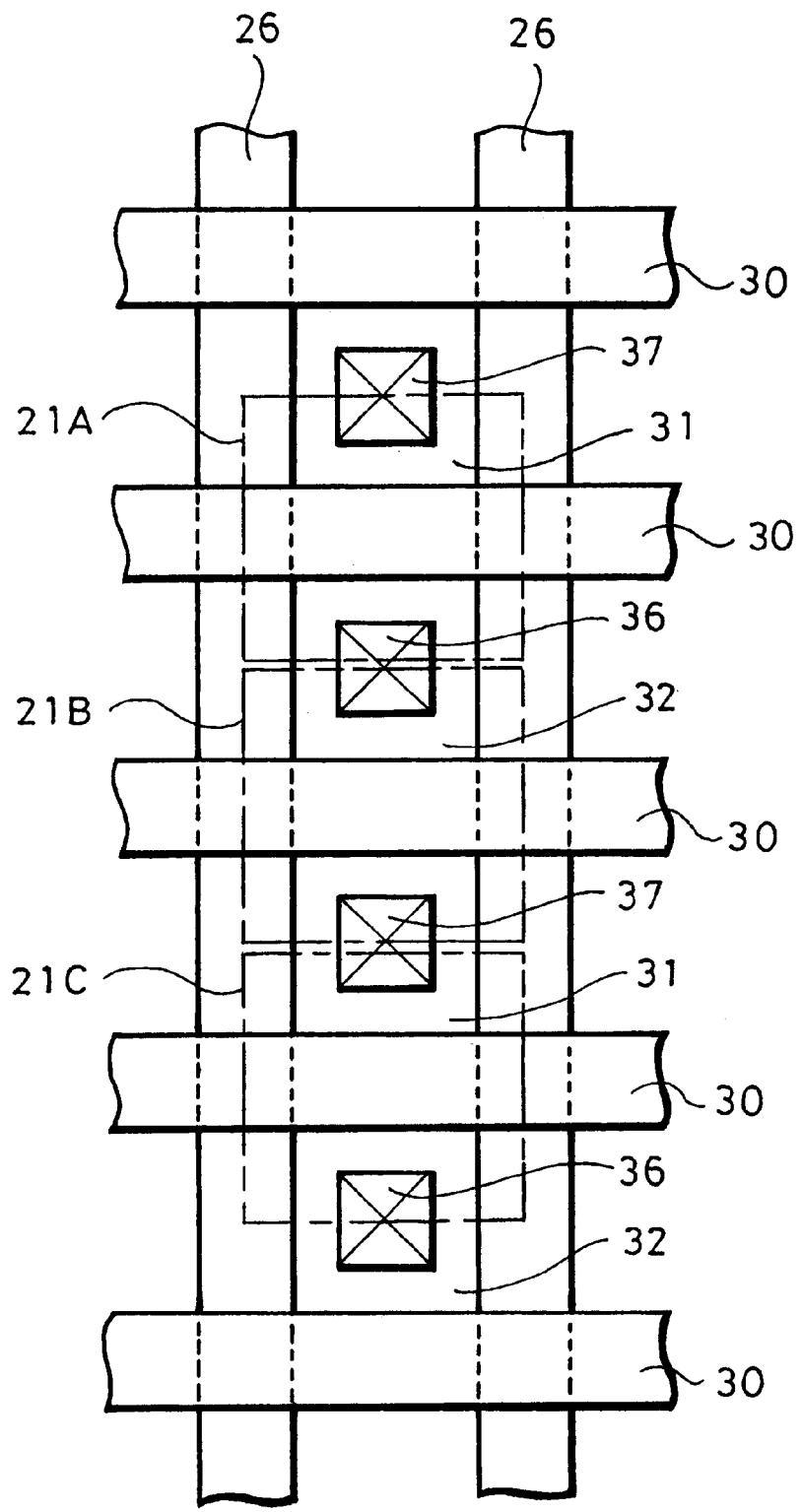
FIG. 17 is a fragmentary plan view of a pixel structure of a solid-state imaging device according to yet still another embodiment of the present invention.

FIG. 17 shows a solid-state imaging device according to yet still another embodiment of the present invention.

In the embodiment shown in FIG. 17, pixel-separating gate electrodes 26 are disposed one on each side of a plurality of pixels arrayed in each column, and the pixels in each column have two common principal electrodes, i.e., a drain electrode and a source electrode. Specifically, the pixel-separating gate electrodes 26 extend vertically one on each side of pixels 21A, 21B, 21C that are vertically adjacent to each other. The pixels 21A, 21B share a drain region 32, and the pixels 21B, 21C share a source region 31. Gate electrodes 30 of the pixels are disposed perpendicularly to the pixel-separating gate electrodes 26. The gate electrodes 30 are disposed at equal vertical pitches between the common drain region 32 and the common source region 31.

In the embodiment shown in FIG. 17, because the drain region 32 and the source region 31 are shared by those pixels that are vertically adjacent to each other, it is possible to reduce the size of the pixels. Furthermore, the vertical pitches between the gate electrodes 30 that contribute to photoelectric conversion are made equal to each other.

While the pixel in each of the above embodiments has been described as basically comprising an n-channel MOS transistor on a p-type semiconductor substrate, the principles of the present invention are also applicable to a pixel where the p-type and the n-type are switched around, i.e., which basically comprises a p-channel MOS transistor.

According to the above embodiments, in pixels capable of photoelectrically converting incident light into signal charges, storing the signal charges, and producing an output signal voltage depending on the amount of the stored signal charges, even when the potential distribution in the pixel slightly fluctuates due to the interfacial level, etc. and such fluctuations differ in the pixels, the sensitivity linearity is not degraded and fixed pattern noise due to different linear properties of the pixels is suppressed when the stored signal charge is small, i.e., when the illuminance of incident light is small or the generated signal is small.

The above advantages can be obtained by providing a pixel, i.e., a photodetector element, with a potential distribution such that a signal charge tends to be stored in the same location as viewed in plan and a surface channel current is liable to flow.

The above potential distribution is given to the photodetector element by the two-dimensional effect of a potential below a pixel-separating electrode that is provided to electrically separate adjacent pixels, i.e., adjacent photodetector elements. The above advantages can be obtained because the above potential distribution prevents a region where the signal charge is stored and a region where a channel current flows from being separated as viewed in plan even when the signal charge is small.

According to the present invention, the above photodetector element may comprise a MOS transistor. With such an arrangement, the signal charge can easily be stored in the center of a gate of the photodetector element, and the channel current can easily flow.

If the pixel-separating electrode is disposed in surrounding a single photodetector element or a plurality of photodetector elements, then a region where the signal charge is stored and a region where a channel current flows are not separate from each other in the photodetector element, and photodetector elements are sufficiently separate from each other.

If the pixel-separating electrode is disposed in surrounding a plurality of photodetector elements and one principal electrode is shared by the photodetector elements, then it is possible to reduce the size of the pixels.

If pixel-separating electrodes are disposed one on each side of each of the columns, and photodetector elements have control electrodes extending transversely to the pixel-separating electrodes with a principal electrode being shared by adjacent photodetector elements in each of the columns, then it is possible to reduce the size of the pixels, and the pitches along the columns between the control electrodes that contribute to photoelectric conversion are made equal to each other.

If a potential distribution along the depth below the pixel-separating electrode is higher than the potential of the overflow barrier of the photodetector element, lower than the potential of the surface channel, and linearly higher from the overflow barrier toward the surface, the pixel-separating electrode is capable of both separating a channel current between pixels and separating a signal charge between pixels.

If the semiconductor region below the pixel-separating electrode comprises an intrinsic semiconductor or a similar semiconductor, then the potential distribution below the pixel-separating electrode may be set to the above potential distribution so as to be capable of both separating a channel current between pixels and separating a signal charge between pixels.

A solid-state imaging device, i.e., an amplification-type solid-state imaging device, according to the present invention has a novel pixel structure which is designed to suppressing linearity degradation and fixed pattern noise by preventing itself from being divided into regions where signal charges are stored and regions where a surface channel current flows due to potential irregularities in pixels. Particularly, the amplification-type solid-state imaging device has MOS gates for separating adjacent pixels from each other.

FIGS. 5 through 6 show an amplification-type solid-state imaging device according to the present invention.

As shown in FIGS. 5 through 6, the amplification-type solid-state imaging device has a silicon semiconductor substrate 22 of a first conductivity type, e.g., p-type, a semiconductor well region 23 of a second conductivity type, e.g., n-type, disposed on the silicon semiconductor substrate 22, a semiconductor well region 24 of an i-type or a similar type (e.g., p$^{--}$-type semiconductor well region) (i-type semiconductor (so-called intrinsic semiconductor) well region in this embodiment) disposed on the n-type semiconductor well region 23, a MOS transistor disposed as a pixel (photodetector element) 21 in the i-type semiconductor well region 24 for photoelectrically converting incident light into signal charges, storing the signal charges, and producing an output signal voltage depending on the amount of the stored signal charges, and a pixel-separating region 27 of a MOS structure comprising a pixel-separating electrode, i.e., a pixel-separating gate electrode 26, disposed on the i-type semiconductor well region 24 through a gate insulating film 25 in surrounding relation to the pixel 21.

The pixel 21 has a straight gate electrode 30 disposed on a p-type semiconductor region 28 in the i-type semiconductor well region 24 through a gate insulating film 29. An n-type source region 31 and an n-type drain region 32 are disposed vertically, for example, one on each side of the gate electrode 30. The pixel 21 is thus constructed as an n-channel MOS transistor.

The pixel-separating gate electrode 26 comprises a first-layer electrode (of first-layer polycrystalline silicon, for example), and the gate electrode 30 of the pixel 21 comprises a second-layer electrode (of second-layer polycrystalline silicon, for example).

The gate electrode 30 is so thin that it can transmit incident light therethrough. When incident light passes through the gate electrode 30 into the p-type semiconductor region 28, the p-type semiconductor region 28 photoelectrically converts the applied light into a signal charge (holes in this embodiment) and stores the signal charge.

To the source region 31, there is connected a vertical signal line 33 in the form of a metal interconnection made of aluminum, for example, through a source contact 37. A power line 34 in the form of a metal interconnection made of aluminum, for example, is connected to the drain region 32 through a drain contact 36.

A plurality of such pixels are arranged in a one- or two-dimensional array on a common substrate which comprises the p-type semiconductor substrate 22, the n-type semiconductor well region 23 which serves as an overflow barrier region, and the i-type semiconductor well region 24. The pixels are arranged in a matrix, making up an amplification-type solid-state imaging device 38.

The pixels 21 share gate electrodes 30 in respective rows, and have respective source regions 31 connected to common vertical signal lines 33 in respective columns through the source contacts 37 and respective drain regions 32 connected to common power lines 34 in respective columns through the drain contacts 36.

Operation of each of the pixels of the amplification-type solid-state imaging device 38 will be described below. The principles of separation of adjacent pixels and an ability to suppress characteristics irregularities at the time a signal charge is small will be described below with reference to FIGS. 12, 13A, 13B, 14A, and 14B.

FIG. 12, which is similar to FIG. 5, shows in plan an amplification-type pixel 21 in the form of a MOS transistor surrounded by a pixel-separating gate electrode 26 which is formed in a grid-like pattern.

FIGS. 13A and 13B show vertical one-dimensional potentials at points PQ, P$_1$, P$_2$, Q$_1$, Q$_2$, Q$_3$ in the pixel 21 shown in FIG. 12, and FIGS. 14A and 13B show a sensor potential $\phi_{SN}$ and a surface potential $\phi_{CH}$ respectively along the dot-and-dash lines P–P', Q–Q' in FIG. 12. In FIGS. 13A, 13B, 14A, and 14B, V$_g$ represents a voltage applied to the gate electrode 30 of the pixel 21, V$_i$ a voltage applied to the pixel-separating gate electrode 26, and V$_{sub}$ a substrate voltage applied to the substrate 22.

The pixel-separating region 27 having the pixel-separating gate electrode 26 as shown in FIG. 12 properly functions to separate the pixel 21 from adjacent pixels for the following reasons:

As can be seen from the one-dimensional potentials at the points shown in FIGS. 13A and 13B, since the potential distributions in the vicinity of the surface (from the surface to the overflow barrier) at the points P$_2$, Q$_2$ on the pixel-separating gate electrode 26 are lower than the surface channel potential $\phi_{CH}$ at the point PQ, for example, and the potentials in the vicinity of the surface at the points Q$_1$, Q$_3$ in a region shallower than the overflow barrier, no channel current will leak.

Furthermore, since the potential distributions in the vicinity of the surface (from the surface to the overflow barrier) at the points P$_2$, Q$_2$ on the pixel-separating gate electrode 26 are higher than the sensor potential $\phi_{SN}$ where the signal charge is stored at the points PQ, Q$_1$, and since the potential at the point P$_2$ is higher than a potential $\phi_{OF}$ of the overflow barrier in the vicinity of a depth where the signal charge is stored even if the excessive signal charge 8 is stored, the signal charge 8 will not leak into the adjacent pixels.

Stated with respect to separation of the signal charge between the adjacent pixels, since the potentials at the points P$_2$, Q$_2$ are linearly higher from the potential $\phi_{OF}$ of the overflow barrier toward the surface, the excessive signal charge 8 necessarily flows deeply into the substrate, i.e., overflows into the substrate 22, and do not leak into the adjacent pixels.

Below the pixel-separating gate electrode 26, the potential distribution along the depth of the substrate is established such that it is higher than the potential $\phi_{OF}$ of the overflow barrier, lower than the surface channel potential $\phi_{CH}$, and linearly higher from the potential $\phi_{OF}$ of the overflow barrier toward the surface.

The above potential distribution can be achieved by forming the semiconductor region 24 below the pixel-separating gate electrode 30 as a semiconductor region of an i-type or a similar type.

The ability to suppress characteristics irregularities at the time the signal charge 8 is small will be described below.

A comparison between the points PQ, P$_1$, as can be seen from the potential distributions shown in FIG. 13A, shows that the surface channel potential $\phi_{CH}$ at the point PQ is higher than the surface channel potential at the point P$_1$ and the sensor potential $\phi_{SN}$ at the point PQ is lower than the sensor potential at the point P$_1$ due to a two-dimensional effect, i.e., a proximity effect (constricted channel effect), which the potential of the pixel-separating gate (the point P$_2$) has on the potential at the point P$_1$. Therefore, the channel current 11 tends to flow toward the point PQ and the signal charge 8 tends to stay at the point PQ, so that when the amount of the signal charge is small, the signal charge is collected at the point PQ, causing the channel current to tend to flow to the point PQ. Consequently, even when the potential varies owing to the interfacial level and the fixed charge in the gate insulating film, the amplification-type solid-state imaging device 38 is less subject to the phenomenon that is liable to occur with the conventional ring-shaped gate electrode, i.e., a region where the signal charge is stored and a region where the channel current flows are separate from each other.

Specifically, even when the surface channel potential $\phi_{CH}$ and the sensor potential $\phi_{SN}$ suffer irregularities due to the interfacial level and irregularities in the fixed charge in the gate insulating film and the impurity concentration in the semiconductor, the constricted channel effect of the pixel-separating gate is effective to displace the channel current and the position of the region where the signal charge is stored toward the center of the gate electrode of the pixel at all times, for thereby suppressing irregularities of the input/output characteristics at the time the signal charge is small.

The potential at the point PQ is distributed to allow channel current to flow and the signal charge to be collected more easily than at the point $P_1$ because the surface potential $\phi_{CH}$ at the point $P_1$ is lower and the sensor potential $\phi_{SN}$ at the point $P_1$ is higher under the influence of a substantially constant potential distribution (the two-dimensional effect, i.e., the so-called constricted channel effect) along the depth at the point $P_2$ (i.e., below the pixel-separating gate electrode 30).

As described above, according to this embodiment, the pixel 21 is surrounded by the pixel-separating gate electrode 26 in a structure such that the potential below the pixel-separating gate electrode 26 is established so as to be gradually lower from the surface to the depth of the overflow barrier for preventing the signal charge 8 from leaking into the adjacent pixels, the surface potential of the pixel-separating gate electrode 26 is lower than the channel potential in pixel operation to prevent the channel current 11 from flowing into the adjacent pixels, and the constricted channel effect of the potential of the pixel-separating gate region causes the signal charge to be easily stored in the gate center of the pixel 21 and also causes the channel current to flow easily. Even when the potential distribution in the pixel slightly fluctuates due to the interfacial level, etc. and such fluctuations differ in the pixels, the sensitivity linearity is not degraded and fixed pattern noise due to different properties of the pixels is suppressed when the signal charge is small, i.e., when the illuminance of incident line is small.

Further research activities that have been made with respect to the above novel pixel structure have resulted in the following findings:

With the above pixel 21, while the constricted channel effect of the pixel-separating gate electrode 26 with respect to the sensor potential $\phi_{SN}$ is sufficiently large, the constricted channel effect of the pixel-separating gate electrode 26 with respect to the surface channel potential $\phi_{CH}$ is small and insufficient.

The reason for the above small and insufficient constricted channel effect is that since the surface channel potential $\phi_{CH}$ is close to the pixel gate electrode 30 of a constant potential across the thin gate insulating film (e.g., an oxide film) 29, the surface channel potential $\phi_{CH}$ is determined substantially one-dimensionally by the gate electrode 30 of the pixel, and the constricted channel effect of the pixel-separating gate electrode 26 is not effective enough.

The impurity concentration of the p-type semiconductor region 28 for storing the signal charge below the gate electrode 30 is lowered at an end of the gate electrode 30 closer to pixel-separating gate electrode 26 than the center of the gate electrode 30 due to the thermal diffusion in the semiconductor fabrication process, causing the channel current to tend to be collected at the end of the gate electrode 30 for thereby exhibiting an effect contrary to the constricted channel effect of the pixel-separating gate electrode 26.

Figure 14C:
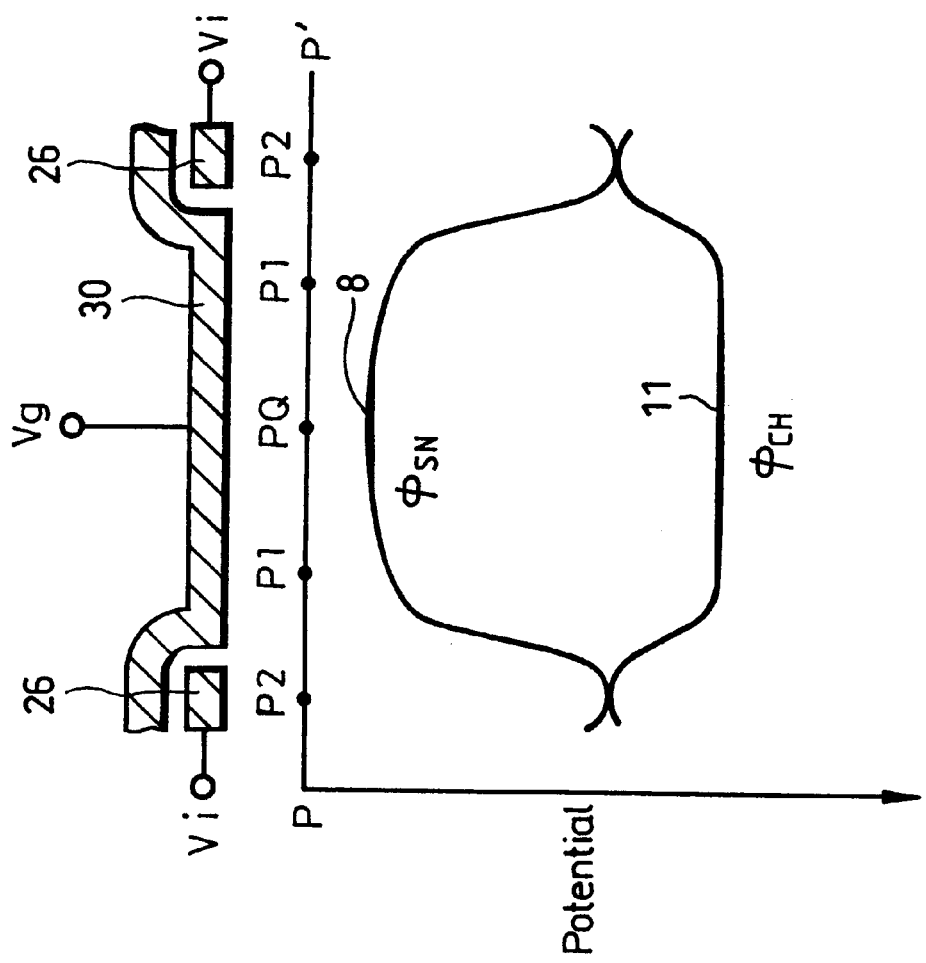
FIG. 14C is a diagram showing a potential distribution on line P–P' of FIG. 12.

FIG. 14C shows a sensor potential $\phi_{SN}$ and a surface channel potential $\phi_{CH}$ along the dot-and-dash line P–P' in FIG. 12. FIG. 14B shows the surface channel potential $\phi_{CH}$ along a line passing through the point PQ and the point $P_1$ parallel to the line Q–Q' in FIG. 12. As shown in FIG. 14C, the sensor potential $\phi_{SN}$ is sufficiently influenced by the constricted channel effect to form a region where the signal charge 8 is stored strongly in the center of the gate of the pixel 2. However, the surface channel potential $\phi_{CH}$ is less effective, and the channel current 11 does not strongly concentrate in the center of the gate of the pixel 2.

The pixel 21 of the basic structure shown in FIGS. 5 through 7 is constructed to bring the signal charge storage region and the surface channel region together in the center of the gate due to the constricted channel effect of the pixel-separating gate electrode 26. In the signal charge storage region, the signal charge tends to gather in the center of the gate on account of the constricted channel effect. In the surface channel region, however, an impurity in the gate surface is diffused into the pixel-separating gate region, lowering the impurity concentration of a potion near the pixel-separating gate region. As a result, the channel current is less liable to gather in the center of the surface channel. Therefore, though the signal charge tends to gather in the center of the gate, the constricted channel effect is not effective enough to cause the channel current to gather in the center of the gate. That is, the constricted channel effect of the pixel-separating gate region is not sufficiently effective to suppress sensitivity irregularities (fixed pattern noise) when the signal charge is small.

An embodiment of the present invention which has improved the above shortcoming will be described below.

FIGS. 18 through 21 show a solid-state imaging device according to such an embodiment of the present invention.

In this embodiment, the solid-state imaging device has a pixel structure for causing a channel current in a surface channel to gather in the center of the gate of the pixel to such an extent that the sensor potential $\phi_{SN}$ will be distributed to cause the signal charge to gather strongly at the center of the gate of the pixel due to the constricted channel effect of the pixel-separating gate.

In the above pixel 21 of the basic structure, the gate insulating film 29 below the gate electrode 30 is of a constant film thickness. In a pixel 41 shown in FIGS. 18 through 20, the gate insulating film 29 below the gate electrode 30 has thicker ends 29b near the pixel-separating gate electrodes 26 than a gate center 29a ($t_1<t_2$).

Figure 18:
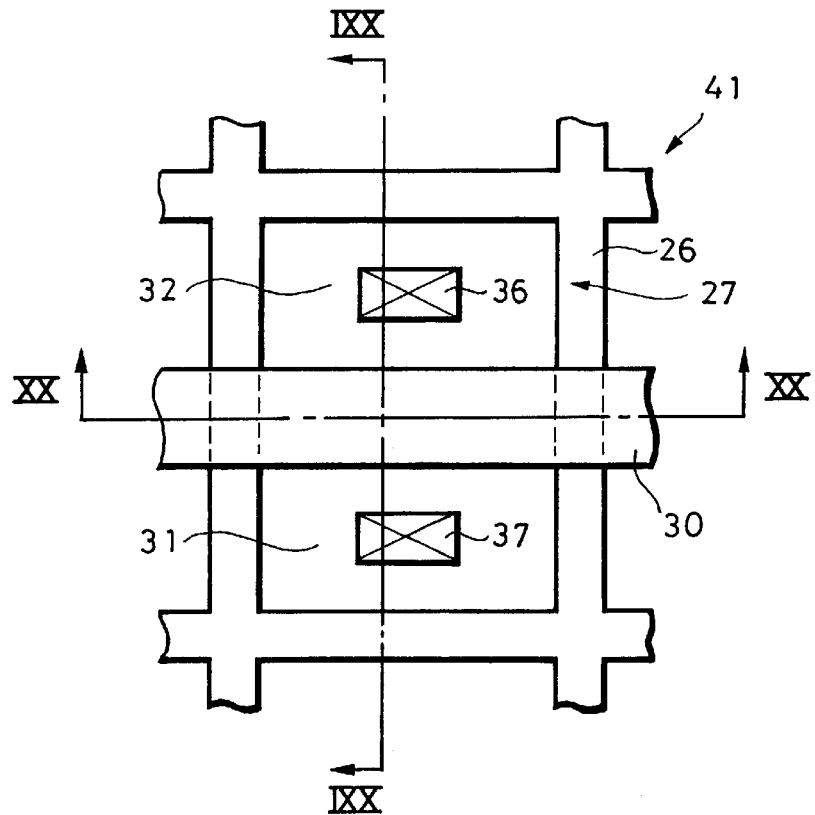
FIG. 18 is a fragmentary plan view of a pixel structure of a solid-state imaging device according to a further embodiment of the present invention.
Figure 19:
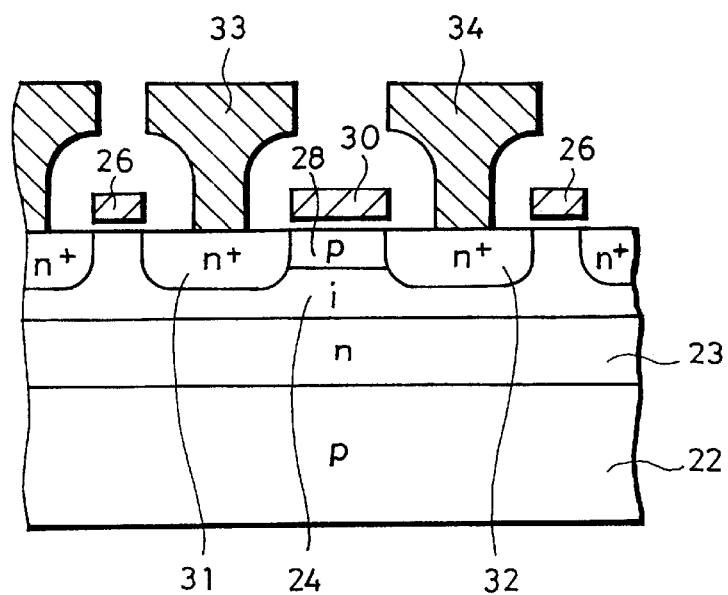
FIG. 19 is a cross-sectional view taken along line IXX—IXX of FIG. 18.
Figure 20:
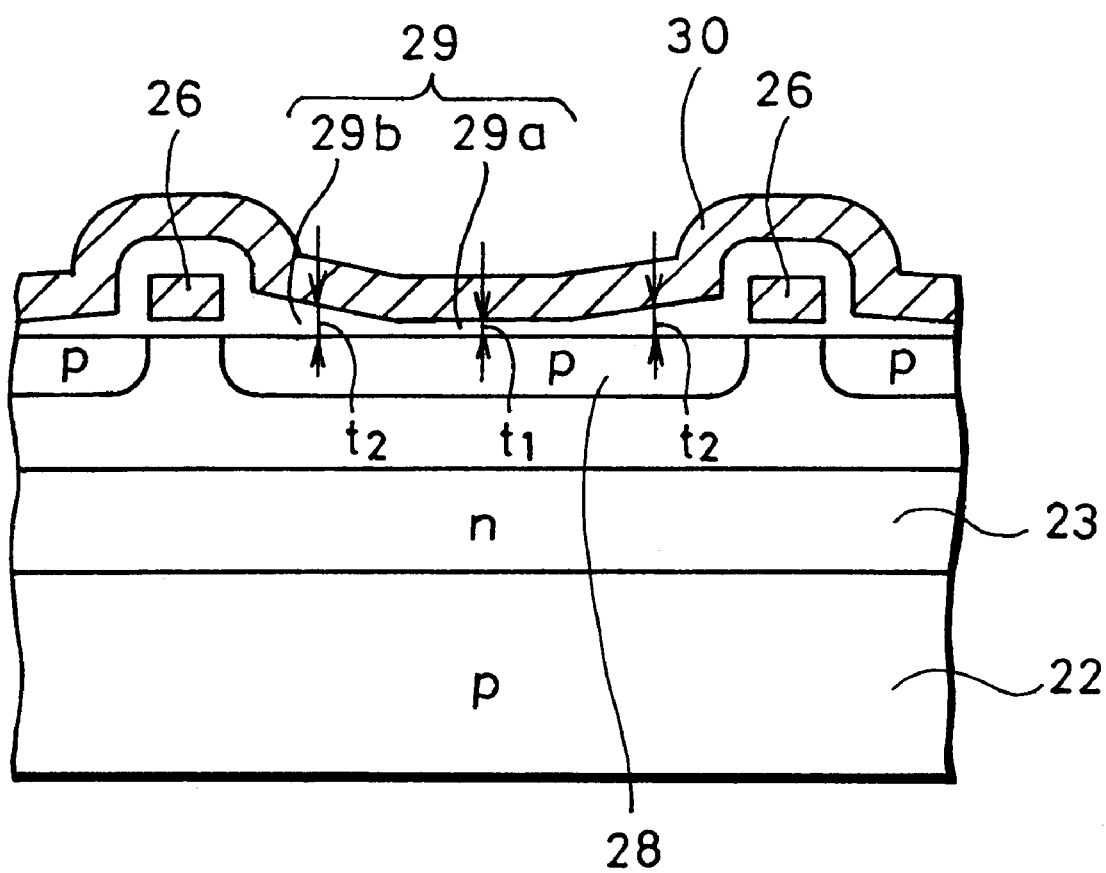
FIG. 20 is a cross-sectional view taken along line XX—XX of FIG. 18.

Those parts shown in FIGS. 18 through 20 which are identical to those shown in FIGS. 5 through 7 are denoted by identical reference numerals, and will not be described in detail below. As shown in FIGS. 18 through 20, the solid-state imaging device has a p-type silicon semiconductor substrate 22, an n-type semiconductor well region 23 disposed as an overflow barrier region on the silicon semiconductor substrate 22, a semiconductor well region 24 of an i-type or a similar type (e.g., p<sup>--</sup>-type semiconductor well region) (i-type semiconductor (so-called intrinsic semiconductor) well region in this embodiment) disposed on the n-type semiconductor well region 23, a MOS transistor disposed as a pixel (photodetector element) 41 in the i-type semiconductor well region 24 for photoelectrically converting incident light into signal charges, storing the signal charges, and producing an output signal voltage depending on the amount of the stored signal charges, and a pixel-separating region 27 of a MOS structure comprising a pixel-separating gate electrode 26 disposed on the i-type semiconductor well region 24 through a gate insulating film 25 in surrounding relation to the pixel 41.

The pixel 41 has a straight gate electrode 30 disposed on a p-type semiconductor region 28 in the i-type semiconductor well region 24 through a gate insulating film 29. An n-type source region 31 and an n-type drain region 32 are disposed vertically, for example, one on each side of the gate electrode 30. The pixel 21 is thus constructed as an n-channel MOS transistor.

The pixel-separating gate electrode 26 comprises a first-layer electrode (of first-layer polycrystalline silicon, for example), and the gate electrode 30 of the pixel 41 comprises a second-layer electrode (of second-layer polycrystalline silicon, for example).

The gate electrode 30 is so thin that it can transmit incident light therethrough. When incident light passes through the gate electrode 30 into the p-type semiconductor region 28, the p-type semiconductor region 28 photoelectrically converts the applied light into a signal charge (holes in this embodiment) and stores the signal charge.

To the source region 31, there is connected a vertical signal line 33 in the form of a metal interconnection through a source contact 37. A power line 34 in the form of a metal interconnection is connected to the drain region 32 through a drain contact 36.

As shown in FIG. 20, the gate insulating film (e.g., oxide film) 29 is thin (film thickness $t_1$) at the gate center 29a and is progressively thicker (film thickness $t_2$) from the gate center 29a toward the gate ends 29b, i.e., toward the pixel-separating gate electrodes 26.

Figure 21:
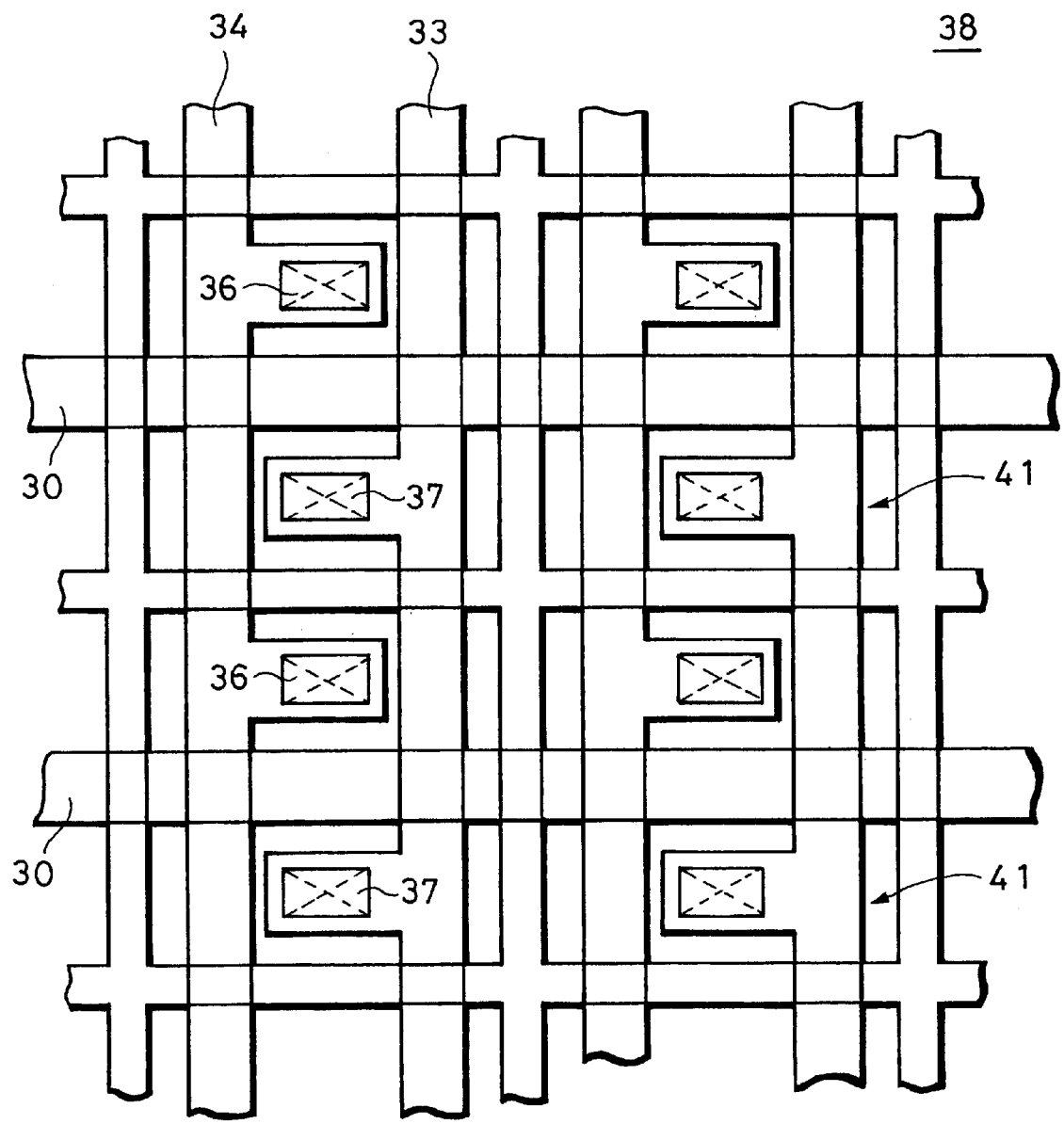
FIG. 21 is a fragmentary plan view of the pixel structure of the solid-state imaging device shown in FIG. 18.

A plurality of such pixels are arranged in a one- or two-dimensional array on a common substrate which comprises the p-type semiconductor substrate 22, the n-type semiconductor well region 23 which serves as an overflow barrier region, and the i-type semiconductor well region 24. As shown in FIG. 21, the pixels are arranged in a matrix, making up an amplification-type solid-state imaging device 38.

The pixels 41 share gate electrodes 30 in respective rows, and have respective source regions 31 connected to common vertical signal lines 33 in respective columns through the source contacts 37 and respective drain regions 32 connected to common power lines 34 in respective columns through the drain contacts 36.

Operation of the pixel 41 of the amplification-type solid-state imaging device 38 will be described below.

Figure 22:
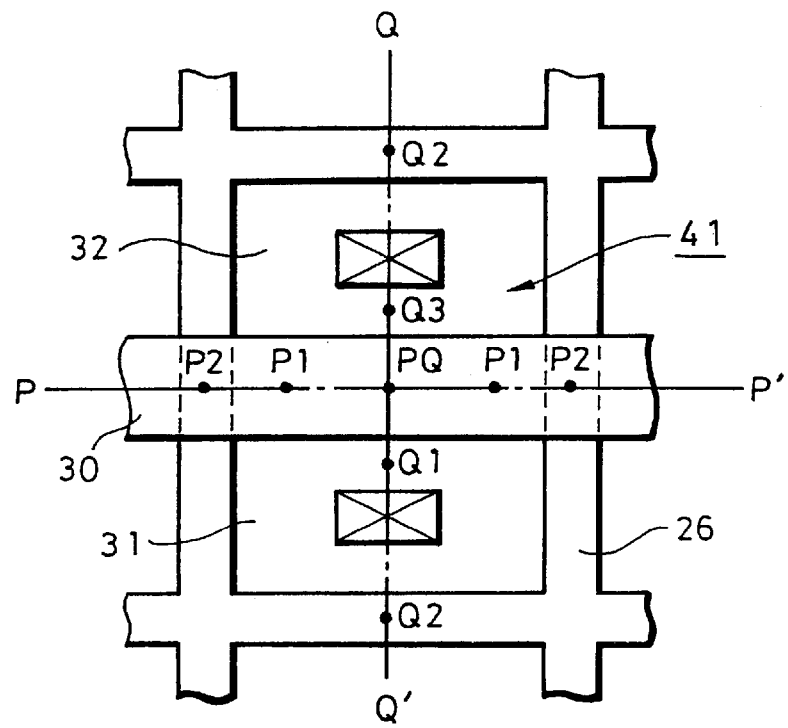
FIG. 22 is a fragmentary plan view of a pixel illustrative of the manner in which the solid-stage imaging device shown in FIG. 18 operates.
Figure 23:
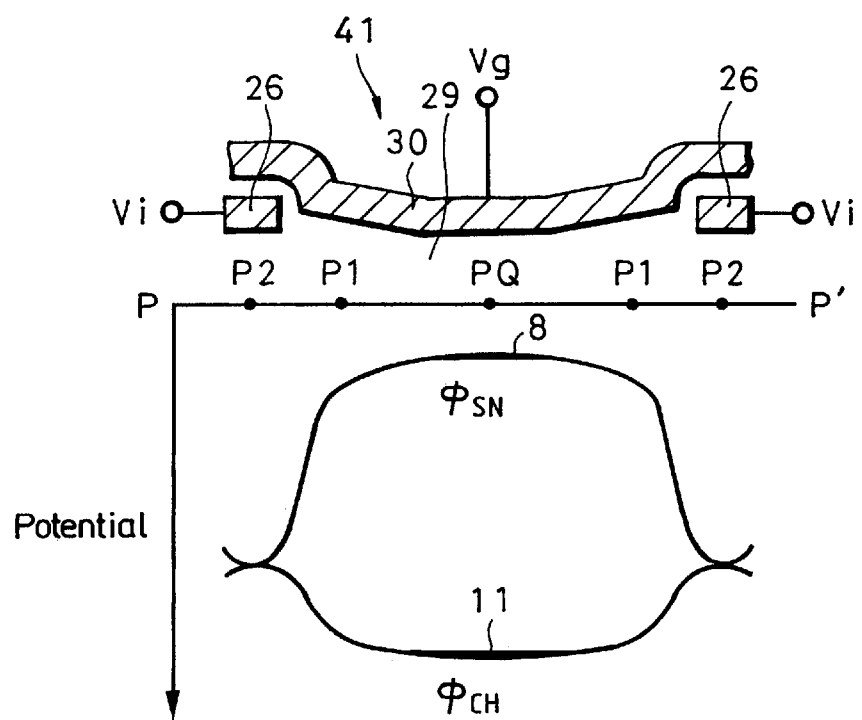
FIG. 23 is a diagram showing a one-dimensional potential distribution on line P–P' of FIG. 22.

FIG. 22 shows a pixel structure which is the same as the pixel structure shown in FIG. 18, showing points PQ, $P_1$, $P_2$, $Q_1$, $Q_2$, $Q_3$. FIG. 23 shows a sensor potential $\phi_{SN}$ and a surface channel potential $\phi_{CH}$ along the line P–P' in FIG. 22.

In the pixel 41 shown in FIG. 22, a one-dimensional potential at the point PQ is the same as that of the basic pixel structure shown in FIG. 5. With respect to a one-dimensional potential at the point $P_1$, the surface channel potential $\phi_{CH}$ is low because the film thickness of the gate insulating film is greater than the potential at the point PQ. As a result, as indicated by the surface channel potential $\phi_{CH}$ and the sensor potential $\phi_{SN}$ in FIG. 23, the constricted channel effect of the pixel-separating gate electrode 26 and the structure of the gate insulating film 29 which is progressively thicker from the gate center of the pixel 41 toward the ends of the pixel-separating gate electrode 26 are effective to provide a distribution of the surface channel potential $\phi_{CH}$ which causes the channel current 11 to concentrate more strongly in the vicinity of the gate center of the pixel 41.

With the pixel 41 shown in FIGS. 18 through 20, even when the surface channel potential $\phi_{CH}$ and the sensor potential $\phi_{SN}$ suffer irregularities in the pixel due to the interfacial level between the gate insulating film and the semiconductor and irregularities of fixed charges in the gate insulating film and the concentration of an impurity in the semiconductor, the distribution of the surface channel potential $\phi_{CH}$ which causes the channel current 11 to concentrate more strongly in the vicinity of the gate center of the pixel 41 will not greatly be disrupted, and the distribution of the sensor potential $\phi_{SN}$ which causes the signal charge to be stored in the vicinity of the gate center of the pixel is the same as that shown in FIG. 14C and will not greatly be disrupted. Therefore, the pixel is almost free of irregularities of the sensitivity such as reductions thereof which would otherwise occur due to different positions where the channel current flows and the signal charge is stored, when the signal charge is small, resulting in suppressed fixed pattern noise at the time the illuminance of incident line is small.

Figure 24:
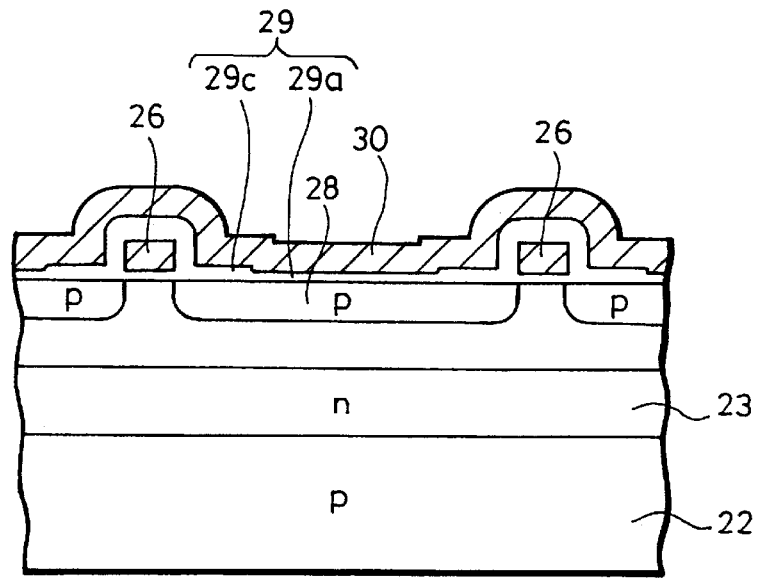
FIG. 24 is a fragmentary cross-sectional view similar to FIG. 20, showing a pixel structure of a solid-state imaging device according to a still further embodiment of the present invention.

FIG. 24 shows a solid-state imaging device according to a still further embodiment of the present invention. The solid-state imaging device according to this embodiment has a pixel structure which includes a gate insulating film 29 below a gate electrode 30 of a pixel 41, the gate insulating film 29 having its film thickness easily variable by the semiconductor fabrication process.

In this embodiment, the gate insulating film 29 below the gate electrode 30 of the pixel 41 has a gate center (point PQ) 29a whose film thickness is the same as that of the basic pixel 21 shown in FIG. 6 and gate ends (points $P_1$) 29c in the vicinity of pixel-separating gate electrodes 26, the gate ends 29c having a film thickness greater than the film thickness of the gate center 29a. Therefore, the gate insulating film 29 has a stepped structure with two film thicknesses. Other structural details of the solid-state imaging device shown in FIG. 24 are identical to those shown in FIGS. 18 through 20.

The solid-state imaging device shown in FIG. 24 can provide the same potential distribution as that of the solid-state imaging device shown in FIGS. 18 through 20 by optimizing the stepped positions of the gate insulating film 29 and the gate insulating film thickness at the points $P_1$.

While the gate insulating film 29 has two film thicknesses in FIG. 24, the gate insulating film 29 may have three or more film thicknesses (not shown).

Figure 25:
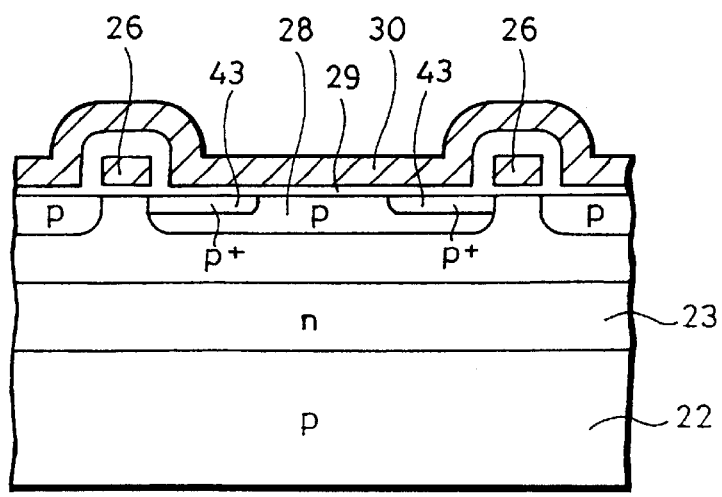
FIG. 25 is a fragmentary cross-sectional view similar to FIG. 20, showing a pixel structure of a solid-state imaging device according to a yet still further embodiment of the present invention.
Figure 26:
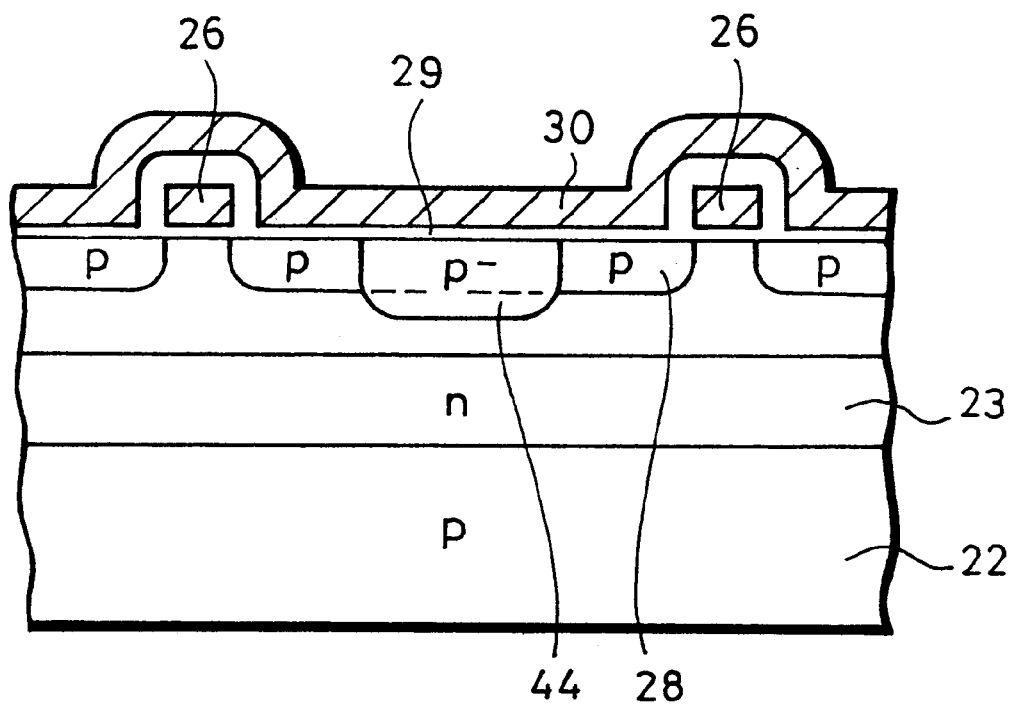
FIG. 26 is a fragmentary cross-sectional view similar to FIG. 20, showing a pixel structure of a solid-state imaging device according to still another embodiment of the present invention.

FIGS. 25 and 26 show solid-state imaging devices according to still further embodiments of the present invention.

In the embodiments shown in FIGS. 25 and 26, the thickness of the gate insulating film 29 below the gate electrode 30 in the pixel is the same as the thickness in the basic pixel 21 shown in FIG. 6, and the impurity concentration of the p-type semiconductor region 28 below the gate electrode 30 varies in the width direction of the channel.

In the embodiment shown in FIG. 25, $p^+$ regions 43 which are higher in concentration than the p-type semiconductor region 28 at its center are disposed in the p-type semiconductor region 28 below the gate electrode 30 respectively at opposite ends of the gate electrode 30. Thus, the impurity concentration of the p-type semiconductor region 28 is smaller at the gate center and greater at the gate ends.

Since the signal charge is gathered in a deep position, it is necessary to collect the channel current at the gate center while keeping the signal charge thus stored. Therefore, the $p^+$ regions 43 are disposed in shallow positions in the p-type semiconductor region 28.

In the embodiment shown in FIG. 26, a $p^-$ region 44 is disposed in the p-type semiconductor region 28 below the gate electrode 30 at the gate center. The p⁻ region 44 is formed by ion implantation of an impurity and has an impurity concentration lower than the p-type semiconductor region 28 at the gate ends. In this manner, the impurity concentration of the p-type semiconductor region 28 is smaller at the gate center and greater at the gate ends.

With the above embodiments, the solid-state imaging devices can provide the same potential distribution as that of the solid-state imaging device shown in FIGS. 18 through 20 by optimizing the impurity concentrations in the vicinity of the points PQ, P₁.

While the p-type semiconductor region 28 has two impurity concentrations in FIGS. 25 and 26, the p-type semiconductor region 28 may have three or more impurity concentrations or have their impurity concentration progressively varying from the center toward the ends thereof.

According to the above embodiments, as described above, the pixel is surrounded by the pixel-separating region of the MOS structure to suppress fixed pattern noise which would otherwise be caused by sensitivity irregularities of the pixel when the signal charge is small in amplification-type solid-stage imaging devices that have ring-shaped gate electrodes.

The film thickness of the gate insulating film below the gate electrode varies from the gate center toward the gate ends or the impurity concentration of the semiconductor region below the gate electrode varies from the gate center toward the gate ends. This arrangement is effective to concentrate the channel current and the signal charge, particularly the channel current flowing in the surface, in the gate center of the pixel due to the constricted channel effect provided by the pixel-separating region of the MOS structure, thereby making it possible to suppress fixed pattern noise caused by sensitivity irregularities of the pixel when the signal charge is small.

While the pixel in each of the above embodiments has been described as basically comprising an n-channel MOS transistor on a p-type semiconductor substrate, the principles of the present invention are also applicable to a pixel where the p-type and the n-type are switched around, i.e., which basically comprises a p-channel MOS transistor.

According to the above embodiments, in pixels capable of photoelectrically converting incident light into signal charges, storing the signal charges, and producing an output signal voltage depending on the amount of the stored signal charges, even when the potential distribution in the pixel slightly fluctuates due to the interfacial level, etc. and such fluctuations differ in the pixels, the sensitivity linearity is not degraded and fixed pattern noise due to different linear properties of the pixels is suppressed when the stored signal charge is small, i.e., when the illuminance of incident line is small or the generated signal is small.

The above advantages can be obtained by providing a pixel-separating electrode for electrically separating adjacent pixels, i.e., photodetector elements, to develop a constricted channel effect due to a potential below the pixel-separating electrode for thereby creating a potential distribution to cause a signal charge to be stored and a surface channel current to flow at the same position as viewed in plan. Therefore, even when the signal charge is small, a region where the signal charge is stored and a region where the channel current flows are not separate from each other.

Since the film thickness of the gate electrode below the control electrode of the pixel varies in the width direction of the channel, the channel current, in particular, tends to flow to a given position, i.e., the center of the control electrode, for thereby suppressing fixed pattern noise due to sensitivity irregularities of each pixel when the signal charge is small.

If the impurity concentration of the semiconductor region below the control electrode of the pixel varies in the width direction of the channel, then the channel current, in particular, also tends to flow to a given position, i.e., the center of the control electrode, for thereby suppressing fixed pattern noise due to sensitivity irregularities of each pixel when the signal charge is small.

If, in the semiconductor region where the impurity concentration below the control electrode varies, a region where the impurity concentration is higher is shallower than a region where the impurity concentration is lower, then it is possible to concentrate the channel current in the given position while keeping the signal charge stored in the given position.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of said photodetector elements from each other, each of said photodetector elements having a potential distribution for causing a signal charge to tend to be stored and a surface channel current to tend to flow in one position as viewed in plan, said element-separating electrodes surrounding at least one photodetector element.

2. A solid-state imaging device comprising a plurality of photodetector elements arranged on a substrate for photoelectrically converting incident light into signal charges, storing the signal charges, and producing an output signal voltage depending on the amount of the stored signal charges, each of said photodetector elements having a potential distribution for causing a signal charge to tend to be stored and a surface channel current to tend to flow in one position as viewed in plan, wherein each of said photodetector elements comprises a MOS photodetector element having two principal electrodes, a control electrode, and an element-separating electrode, wherein said element-separating electrode surrounds at least one photodetector element.

3. A solid-state imaging device comprising a plurality of photodetector elements arranged on a substrate for photoelectrically converting incident light into signal charges, storing the signal charges, and producing an output signal voltage depending on the amount of the stored signal charges, each of said photodetector elements having a potential distribution for causing a signal charge to tend to be stored and a surface channel current to tend to flow in one position as viewed in plan, wherein each of said photodetector elements comprises a MOS photodetector element having two principal electrodes, a control electrode, and an element-separating electrode, wherein said element-separating electrode surrounds a plurality of photodetector elements, one of said principal electrodes being shared by said plurality of photodetector elements.

4. A solid-state imaging device according to claim 2, wherein said element-separating electrodes are disposed on each side of each of columns of the photodetector elements, said control electrode extending transversely across said element-separating electrodes, said principal electrodes being shared by adjacent ones of said photodetector elements in each of said columns.

5. A solid-state imaging device according to claim 1, wherein a potential distribution along the depth below each of said element-separating electrodes is higher than a potential of an overflow barrier of each of said photodetector elements, lower than a potential of a surface channel thereof, and increasingly higher than the overflow barrier proceeding toward a center thereof.

6. A solid-state imaging device according to claim 1, wherein a semiconductor region below each of said element-separating electrodes comprises an intrinsic semiconductor.

7. A solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of said photodetector elements from each other, each of said photodetector elements having a control electrode and a gate insulating film below said control electrode, said gate insulating film having a film thickness varying in the direction of a width of a channel of the gate insulating film.

8. A solid-state imaging device comprising a plurality of photodetector elements arranged on a substrate for photoelectrically converting incident light into signal charges, storing the signal charges, and producing an output signal voltage depending on the amount of the stored signal charges, and element-separating electrodes for electrically separating adjacent ones of said photodetector elements from each other, each of said photodetector elements having a control electrode and a semiconductor region below said control electrode, said semiconductor region having an impurity concentration varying in the direction of a width of a channel of the gate insulating film.

9. A solid-state imaging device according to claim 8, wherein said semiconductor region includes a first region and a second region, said first region having impurity concentration that is higher than that of said second region, and said first region is shallower than said second region.

10. The solid-state imaging device of claim 2, wherein said channel-separating electrode surrounds a plurality of photodetector elements.

\* \* \* \* \*